(12) United States Patent
Kim et al.

(10) Patent No.: US 8,982,639 B2
(45) Date of Patent: Mar. 17, 2015

(54) NONVOLATILE MEMORY DEVICE AND METHOD OF DRIVING THE SAME

(75) Inventors: Jong-Young Kim, Seoul (KR); Myung-Hoon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 422 days.

(21) Appl. No.: 13/432,149

(22) Filed: Mar. 28, 2012

(65) Prior Publication Data

US 2012/0257452 A1 Oct. 11, 2012

(30) Foreign Application Priority Data

Apr. 8, 2011 (KR) ........................ 10-2011-0032907

(51) Int. Cl.
| | | |
|---|---|---|
| G11C 11/34 | (2006.01) | |
| G11C 16/04 | (2006.01) | |
| G11C 16/24 | (2006.01) | |
| H01L 27/115 | (2006.01) | |

(52) U.S. Cl.
CPC ............ G11C 16/0483 (2013.01); G11C 16/24 (2013.01); H01L 27/11565 (2013.01); H01L 27/1157 (2013.01); H01L 27/11573 (2013.01); H01L 27/11578 (2013.01); H01L 27/11582 (2013.01)
USPC ............ 365/185.23; 365/189.16; 365/189.17; 365/174

(58) Field of Classification Search
USPC ................... 365/185.23, 189.16, 189.17, 174
See application file for complete search history.

(56) References Cited

U.S. PATENT DOCUMENTS

| | | | | |
|---|---|---|---|---|
| 5,532,971 | A * | 7/1996 | Tanaka et al. ............ | 365/230.06 |
| 6,226,214 | B1 * | 5/2001 | Choi ........................ | 365/230.03 |
| 6,256,227 | B1 * | 7/2001 | Atsumi et al. ............ | 365/185.11 |
| 7,151,686 | B2 | 12/2006 | Sugimae et al. | |
| 7,738,313 | B2 | 6/2010 | Futatsuyama | |
| 7,821,832 | B2 | 10/2010 | Hahn | |
| 2009/0185422 | A1 | 7/2009 | Kang et al. | |

FOREIGN PATENT DOCUMENTS

| | | |
|---|---|---|
| JP | 2005100538 | 4/2005 |
| JP | 2008084457 | 4/2008 |
| KR | 1020050030609 A | 3/2005 |
| KR | 1020090080337 A | 7/2009 |
| KR | 1020090108451 A | 10/2009 |

* cited by examiner

*Primary Examiner* — Han Yang
(74) *Attorney, Agent, or Firm* — Volentine & Whitt, PLLC

(57) ABSTRACT

A nonvolatile memory device includes a plurality of memory blocks, and a pass transistor array transmitting a plurality of drive signals to a selected memory block among the plurality of memory blocks in response to a block select signal. The pass transistor array includes high voltage transistors including one common drain and two sources formed in one active region and one of the plurality of drive signals transmitted to the common drain is transmitted to different memory blocks through the two sources.

19 Claims, 16 Drawing Sheets

NONVOLATILE MEMORY DEVICE AND METHOD OF DRIVING THE SAME

CROSS-REFERENCE TO RELATED APPLICATIONS

A claim of priority under 35 U.S.C. §119 is made to Korean Patent Application No. 10-2011-0032907, filed on Apr. 8, 2011, the entire contents of which are hereby incorporated by reference.

BACKGROUND

The present inventive concept herein relates to a semiconductor memory device, and more particularly, to a nonvolatile memory device.

Semiconductor devices are memory devices fabricated from semiconductor material such as silicon, germanium, gallium arsenide and indium phospide. Semiconductor memory devices are generally classified as either volatile memory devices or nonvolatile memory devices.

Volatile memory devices lose their stored data when the supply of power is interrupted, and examples thereof include static random access memory (SRAM), dynamic RAM (DRAM), and synchronous DRAM (SDRAM). On the other hand, nonvolatile memory devices retain their stored data even when the supply of power is interrupted. Examples of nonvolatile memory devices include read only memory (ROM), programmable ROM (PROM), electrically programmable ROM (EPROM), electrically erasable and programmable ROM (EEPROM), flash memory, phase change RAM (PRAM), magnetic RAM (MRAM), resistive RAM (RRAM), and ferroelectric RAM (FRAM).

SUMMARY

Embodiments of the inventive concept provide a nonvolatile memory device which includes a plurality of memory blocks, and a pass transistor array transmitting a plurality of drive signals to a selected memory block among the plurality of memory blocks in response to a block select signal. The pass transistor array includes high voltage transistors including one common drain and two sources formed in one active region and one of the plurality of drive signals transmitted to the common drain is transmitted to different memory blocks through the two sources.

Embodiments of the inventive concept also provide a nonvolatile memory device which includes a first memory block and a second memory block, and two pass transistors selectively transmitting a word line voltage to one of the first and second memory blocks in response to a block select signal. The two pass transistors include a first gate line and a second gate line formed in parallel to each other on one active region, a common drain formed between the first gate line and the second gate line and provided with the word line voltage, a first source outputting the word line voltage provided in the common drain to the first memory block in response to a first block select signal, and a second source outputting the word line voltage provided in the common drain to the second memory block in response to a second block select signal.

Embodiments of the inventive concept further provide a nonvolatile memory device which includes a memory cell array comprising a plurality of memory blocks, a first pass transistor portion located adjacent a first side of the memory cell array, and a second pass transistor portion located adjacent a second side of the memory cell array opposite the first side. The first pass transistor portion including first high voltage transistors including one common drain and two sources formed in one active region, and one of a plurality of first drive signals transmitted to the common drain is transmitted to first and second memory blocks among the plurality of memory blocks through the two sources. The second pass transistor portion including second high voltage transistors including one common drain and two sources formed in one active region, and one of a plurality of second drive signals transmitted to the common drain is transmitted to third and fourth memory blocks among the plurality of memory blocks through the two sources.

BRIEF DESCRIPTION OF THE FIGURES

The foregoing and other features and advantages of the inventive concept will become apparent from the detailed description that follows, with reference to the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Preferred embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like numbers refer to like elements throughout.

Figure 1:
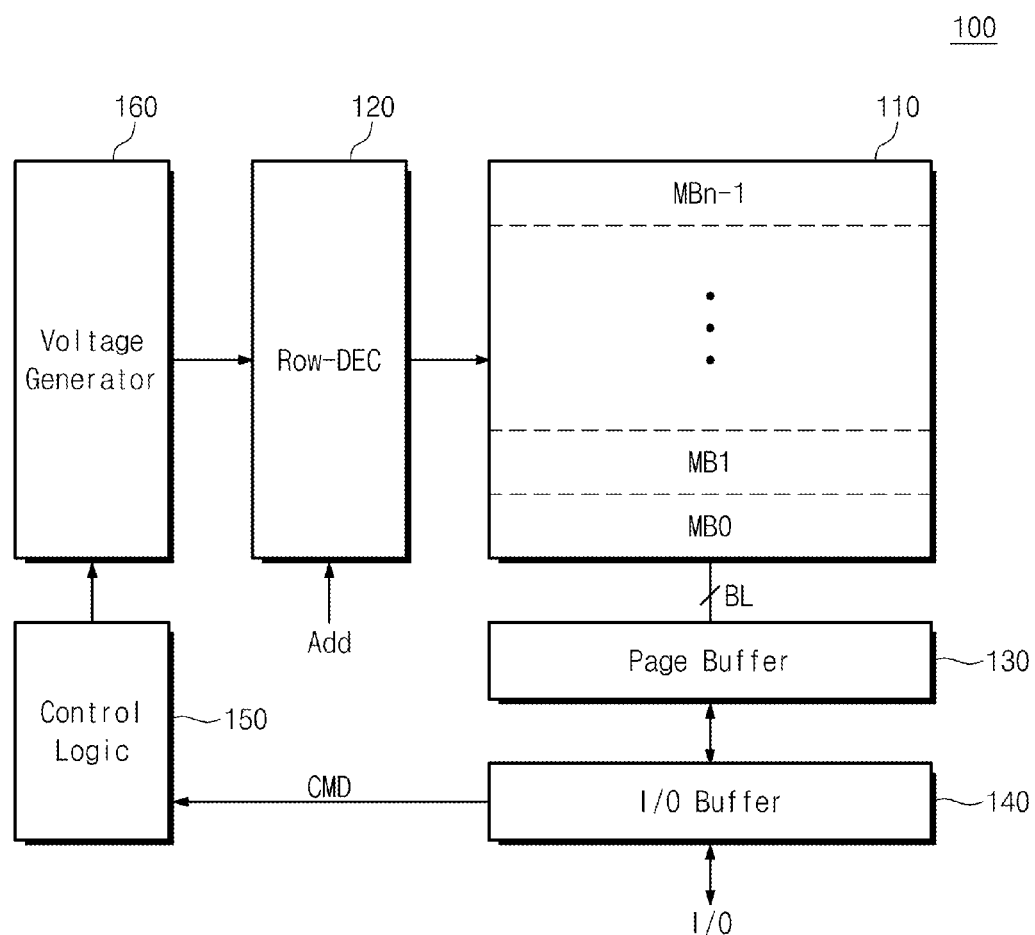
FIG. 1 is a block diagram of a nonvolatile memory device in accordance with embodiments of the inventive concept.

FIG. 1 is a block diagram of a nonvolatile memory device in accordance with embodiments of the inventive concept. Referring to FIG. 1, a nonvolatile memory device 100 may include a cell array 110, a row decoder 120, a page buffer 130, an input/output buffer 140, control logic 150 and a voltage generator 160.

The cell array 110 is connected to the row decoder 120 through word lines WL and selection lines SSL and GSL. The cell array 110 is connected to the page buffer 130 through bit lines BL. The cell array 110 includes a plurality of NAND type cell strings. Each of the cell strings may form a channel in a vertical direction or in a horizontal direction. A plurality of word lines may be vertically stacked in the cell array 110. Each of the word lines constitutes a control gate of memory cells included in the cell string. In this case, a channel of a memory cell may be formed in a vertical direction (for example, in parallel to the cell string).

The cell array 110 includes a plurality of memory blocks (MB0~MBn−1, n is natural number). The cell array 110 may be erased by each memory block unit. The memory blocks are comprised of a plurality of cell strings. The cell string is a unit of memory cells serially connected to each other. Memory cells included in one cell string are selected by a same select transistor.

The row decoder 120 may select one of the memory blocks of the cell array in response to a row address. The row decoder 120 may select one of word lines of the selected memory block. The row decoder 120 transmits a voltage from the voltage generator 160 to the word lines of the selected memory block or to select lines SSL and GSL. In particular, a high voltage is supplied to word lines of the selected memory block. Thus, to transmit a high voltage, the row decoder 120 includes a pass transistor constituted by a high voltage transistor.

As will be discussed later herein, an occupied area of the decoder 120 of the inventive concept may be reduced by reconstructing an array structure and a layout structure of the pass transistor. In addition, as will also be discussed later herein, interference between block word lines or between the pass transistors may be reduced.

The page buffer 130 operates as a write driver or a sense amplifier depending on an operation mode. When a program operation is performed, the page buffer 130 transmits a voltage corresponding to data to be programmed to a bit line of the cell array 110 in which cell strings are formed in a vertical structure. When a read operation is performed, the page buffer 130 senses data stored in the selected memory cell through a bit line, and then the page buffer 130 transmits the sensed data to the input/output buffer 140.

The input/output buffer 140 transmits data received from the outside (i.e., externally received data) to the page buffer 130 or outputs data provided from the page buffer 130 to the outside. The input/output buffer 140 transmits a received address or a received command to the control logic 150 or to the row decoder 120.

The control logic 150 performs a control operation for executing program, read and erasure operations in response to a command transmitted from the input/output buffer 140. When a read operation is performed, the control logic 150 controls the voltage generator 160 to generate a select read voltage Vrd, an unselect read voltage Vread and select line voltages $V_{SSL}$ and $V_{GSL}$. Also, the control logic 150 controls the page buffer 130 to sense data through a bit line BL.

In response to a control of the control logic 150, the voltage generator 160 generates various word line voltages to be provided to each word line and a voltage to provided to a bulk (for example, a well region) in which memory cells are formed. There are a program voltage Vpgm, a pass voltage Vpass, a select read voltage Vrd and an unselect read voltage Vread as word line voltages to be provided to each word line. The voltage generator 160 may generate select line voltages $V_{SSL}$ and $V_{GSL}$ being provided to select lines SSL and GSL when a read operation and a program operation are performed.

In the row decoder 120 of the nonvolatile memory device 100, interference may be cut off between block select signals BLKWL of a high voltage. According to a structure of the row decoder 120 of the inventive concept, an occupied area of pass transistor driven by block select signals BLKWL may be reduced.

Figure 2:
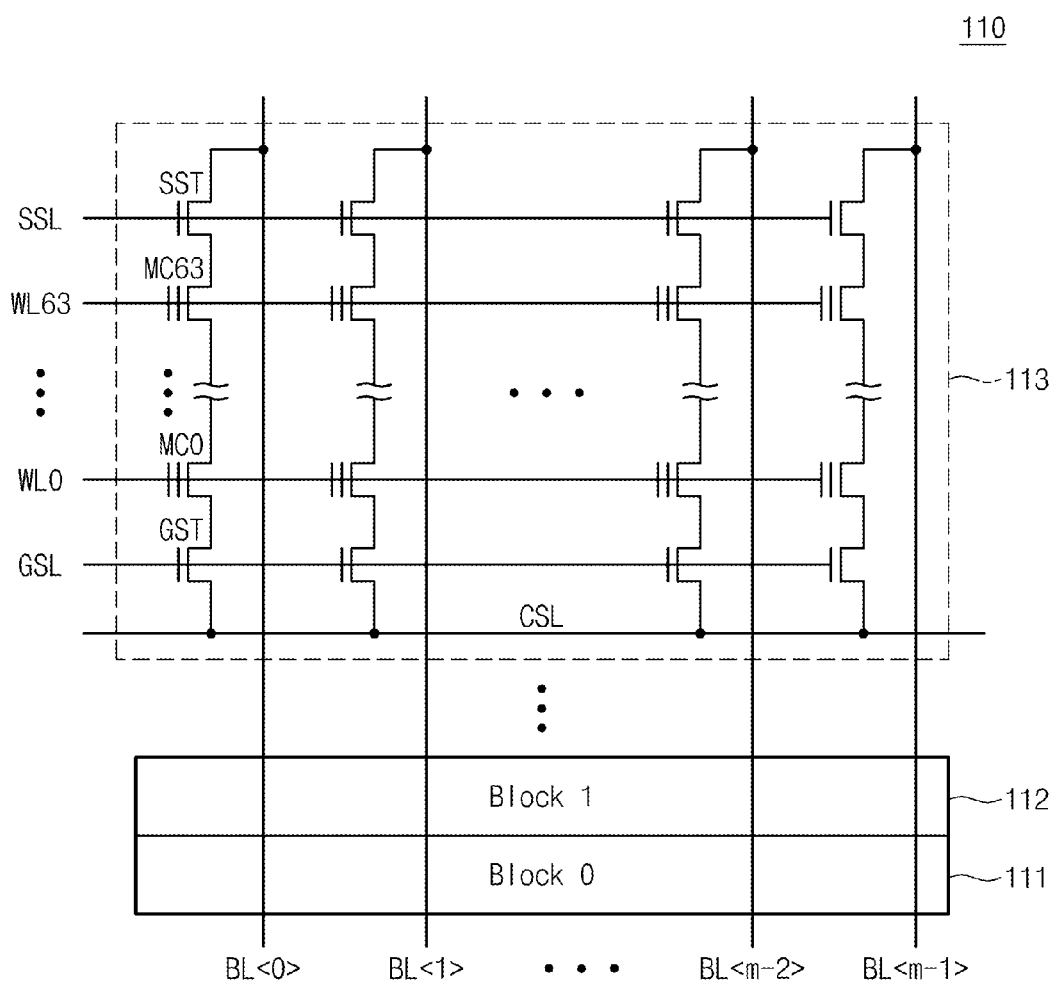
FIG. 2 is a block diagram more specifically illustrating a memory cell array of FIG. 1.

FIG. 2 is a block diagram more specifically illustrating a memory cell array of FIG. 1. Referring to FIG. 2, the cell array 110 includes a plurality of memory blocks 111, 112 and 113. The memory blocks 111, 112 and 113 may each include a plurality of NAND cell strings. One NAND cell string is connected to a bit line BL, a string select line SSL, a ground select line GSL, word lines WL and a common source line CSL. That is, each memory block is connected to a plurality of bit lines BL, a plurality of string select lines SSL, a plurality of ground select lines GSL, a plurality of word lines WL and a common source line CSL.

Each of the memory blocks 111, 112 and 113 is connected to select lines SSL and GSL and a plurality of word lines WL0~WL63. Select signals SS and GS are applied to the select lines SSL and GSL. The string select signal SS is applied to the string select line SSL. A string select transistor SST is turned on or turned off depending on a level of the string select signal SS. The ground select signal GS is applied to the ground select line GSL. A ground select transistor GST is switched depending on a level of the ground select signal GS.

A word line voltage $V_{WL}$ generated from the voltage generator 160 is applied to the word lines WL0~WL63. The word line voltage $V_{WL}$ may include a program voltage Vpgm, an unselect read voltage Vread, a read voltage Vrd, a pass voltage Vpass and a verify voltage Vfy. The unselect read voltage Vread is a voltage provided to an unselected word line when a read operation is performed. The read voltage Vrd is a voltage provided to a selected word line when a read operation is performed.

The program voltage Vpgm, the pass voltage Vpass and the unselect read voltage Vread correspond to relatively a high voltage. Thus, the row decoder 120 includes a switching device that can apply a high voltage. That is, the row decoder 120 includes a pass transistor array than can endure a high voltage.

Herein, as will be understood by those skilled in the art, a "high voltage" means a voltage exceeding a power supply voltage, and a "high voltage transistor" means a transistor configured to handle a high voltage. For example, a channel of high voltage transistor constituting the pass transistor may be formed to be longer than a channel of low voltage transistor to endure a high voltage (that is, to prevent a punch-through between a source and a drain). A gate oxide layer of a high voltage transistor may be formed to be thicker than a gate oxide layer of low voltage transistor to endure a high voltage (that is, to endure a high electrical potential difference between a gate and a drain/source). For these reasons, a high voltage transistor generally requires a wider chip area than a low voltage transistor.

As such, while a size of memory cell may be reduce through fabrication advancements and the like, it is relatively difficult to reduce a size of pass transistor.

Figure 3:
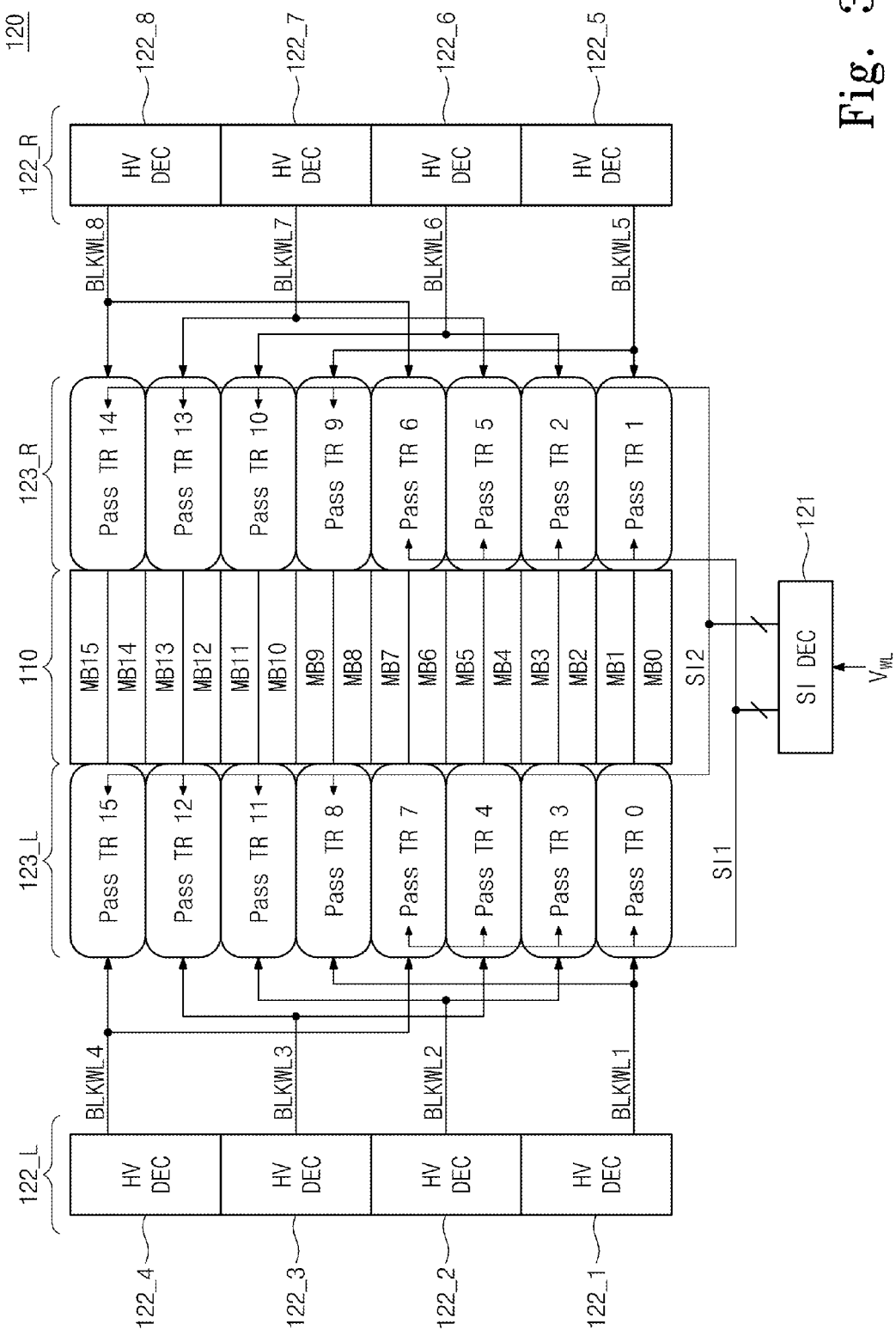
FIG. 3 is a block diagram more specifically illustrating a structure of row decoder of FIG. 1.

FIG. 3 is a block diagram more specifically illustrating a structure of the row decoder 120 of FIG. 1. Referring to FIG. 3, as an illustration, the row decoder 120 is configured to drive 16 memory blocks MB0~MB15. The row decoder 120 includes a SI decoder 121, a block decoder portion (122L, 122R) and a pass transistor portion (123_L, 123_R).

The SI decoder 121 outputs select signals and a word line voltage (hereinafter, a drive signal) to first drive signal lines SI1 when a block address being input corresponds to memory blocks MB0~MB7. The SI decoder 121 outputs select signals and a word line voltage to second drive signal lines SI2 when a block address being input corresponds to memory blocks MB8~MB15.

The block decoder portion (122_L, 122_R) activates one of a plurality of block select signals BLKWL1~BLKWL8 in response to a block address (not illustrated). One pass transistor array included in the pass transistor portion (123_L, 123_R) is activated by the activated block select signal. The block decoder portion (122_L, 122_R) includes a first block decoder portion 122_L disposed on the left of the memory blocks and a second block decoder portion 122_R disposed on the right of the memory blocks.

The first block decoder portion 122_L controls the first transistor portion 123_L disposed on the left of the memory block 110. The first block decoder portion 122_L includes first through fourth high voltage decoders 122_1~122_4. The first high voltage decoder 122_1 activates a block select signal BLKWL1 in response to the block address. The block select signal BLKWL1 is concurrently applied to a pass transistor array (Pass TR 0) and a pass transistor array (Pass TR 8) that are separated from each other. That is, a plurality of high voltage transistors included in the pass transistor array (Pass TR 0) and the pass transistor array (Pass TR 8) is controlled by the first high voltage decoder 122_1.

The second high voltage decoder 122_2 activates a block select signal BLKWL2 in response to the block address. The block select signal BLKWL2 is concurrently applied to a pass transistor array (Pass TR 3) and a pass transistor array (Pass TR 11) that are separated from each other. That is, a plurality of high voltage transistors included in the pass transistor array (Pass TR 3) and the pass transistor array (Pass TR 11) is controlled by the second high voltage decoder 122_2.

The third high voltage decoder 122_3 activates a block select signal BLKWL3 in response to the block address. The block select signal BLKWL3 is concurrently applied to a pass transistor array (Pass TR 4) and a pass transistor array (Pass TR 12) that are separated from each other. That is, a plurality of high voltage transistors included in the pass transistor array (Pass TR 4) and the pass transistor array (Pass TR 12) is controlled by the third high voltage decoder 122_3.

The fourth high voltage decoder 122_4 activates a block select signal BLKWL4 in response to the block address. The block select signal BLKWL4 is concurrently applied to a pass transistor array (Pass TR 7) and a pass transistor array (Pass TR 15) that are separated from each other. That is, a plurality of high voltage transistors included in the pass transistor array (Pass TR 7) and the pass transistor array (Pass TR 15) is controlled by the fourth high voltage decoder 122_4.

The second block decoder portion 122_R controls the second transistor portion 123_R disposed on the right of the memory block 110. The second block decoder portion 122_R includes fifth through eighth high voltage decoders 122_5~122_8. The fifth high voltage decoder 122_5 activates a block select signal BLKWL5 in response to the block address. The block select signal BLKWL5 is concurrently applied to a pass transistor array (Pass TR 1) and a pass transistor array (Pass TR 9) that are separated from each other. That is, a plurality of high voltage transistors included in the pass transistor array (Pass TR 1) and the pass transistor array (Pass TR 9) is controlled by the fifth high voltage decoder 122_5.

The sixth high voltage decoder 122_6 activates a block select signal BLKWL6 in response to the block address. The block select signal BLKWL6 is concurrently applied to a pass transistor array (Pass TR 2) and a pass transistor array (Pass TR 10) that are separated from each other. That is, a plurality of high voltage transistors included in the pass transistor array (Pass TR 2) and the pass transistor array (Pass TR 10) is controlled by the sixth high voltage decoder 122_6.

The seventh high voltage decoder 122_7 activates a block select signal BLKWL7 in response to the block address. The block select signal BLKWL7 is concurrently applied to a pass transistor array (Pass TR 5) and a pass transistor array (Pass TR 13) that are separated from each other. That is, a plurality of high voltage transistors included in the pass transistor array (Pass TR 5) and the pass transistor array (Pass TR 13) is controlled by the seventh high voltage decoder 122_7.

The eighth high voltage decoder 122_8 activates a block select signal BLKWL8 in response to the block address. The block select signal BLKWL8 is concurrently applied to a pass transistor array (Pass TR 6) and a pass transistor array (Pass TR 14) that are separated from each other. That is, a plurality of high voltage transistors included in the pass transistor array (Pass TR 6) and the pass transistor array (Pass TR 14) is controlled by the eighth high voltage decoder 122_8.

The pass transistor portions 123_L and 123_R are disposed on the left and right of the memory blocks 110 respectively. A first pass transistor portion 123_L formed on the left of the memory blocks 110 includes pass transistor portions Pass TR 0, Pass TR 3, Pass TR 4 and Pass TR 7 sharing the first drive signal line SI 1. Also, the first pass transistor portion 123_L includes pass transistor portions Pass TR 8, Pass TR 11, Pass TR 12 and Pass TR 15 sharing the second drive signal line SI 2.

The pass transistor array (Pass TR 0) and the pass transistor array (Pass TR 8) forming a common gate driven by the block select signal BLKWL may be independently driven by the first drive signal line SI1 and the second drive signal line SI2 that are selectively activated. That is, if the block select signal BLKWL1 is activated and the first drive signal line SI1 is activated, the pass transistor array (Pass TR 0) transmits a drive signal provided through the first drive signal line SI1 to a memory block MB0. The first drive signal line SI1 and the second drive signal line SI2 are mutually exclusively activated or inactivated. Thus, even though the block select signal BLKWL1 is shared, only one of the memory blocks MB0 and MB8 may be selected. This block select structure may be equally applied to the second pass transistor portion 123_R.

According to the pass transistor portion 123_L and 123_R having the structure described above, pass transistors driven by different block select signals BLKWL may be formed on one active region. Thus, in the case that two pass transistors are formed on one active region, a channel direction size of the pass transistor portion (123_L, 123_R) may be reduced. Additional space between signal lines of the block select signals BLKWL can be obtained by reducing the channel direction size.

Figure 4:
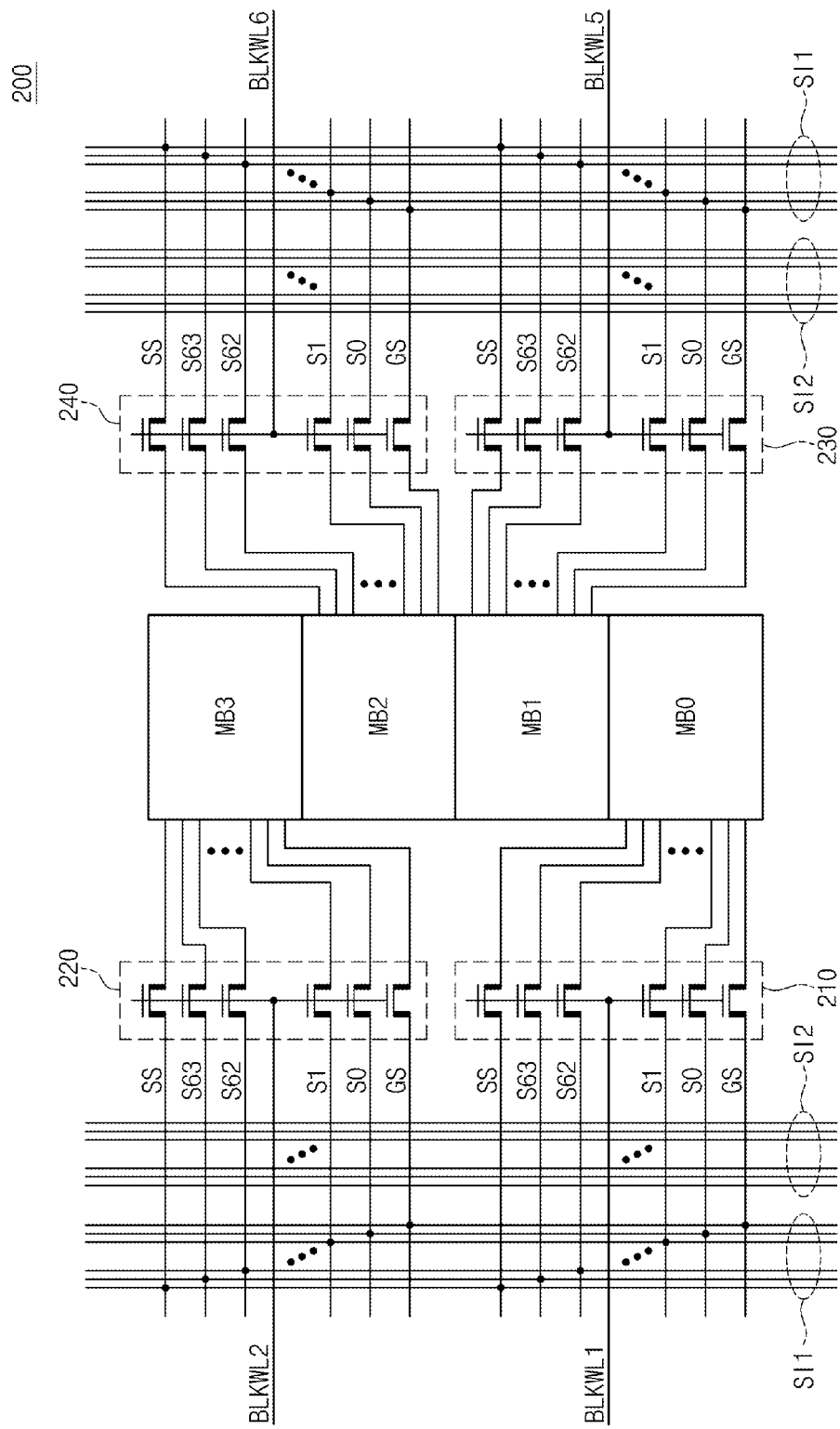
FIG. 4 is a drawing illustrating a part of FIG. 3.

FIG. 4 is a circuit diagram illustrating a connection relation between the first and second drive lines (SI1,SI2) and the pass transistor arrays to select the memory blocks MB0~MB3 of FIG. 3. Referring to FIG. 4, the first drive signal SI1 may be transmitted to the memory blocks MB0~MB3 through a plurality of pass transistors 210, 220, 230 and 240.

In the case that the memory block MB0 is selected, the block select line BLKWL1 is activated. When the block select line BLKWL1 is activated, all the pass transistors included in the pass transistor array 210 are turned on. At this time, drive signals GS, SS, S0~S63 transmitted through the first drive signal line SI1 are applied to the memory block MB0. The drive signals GS, SS, S0~S63 may be provided to gates of select transistors SST and GST and memory cells of the memory block MB0.

In the case that the memory block MB3 is selected, the block select line BLKWL2 is activated. When the block select line BLKWL2 is activated, all the pass transistors included in the pass transistor array 220 are turned on. At this time, drive signals GS, SS, S0~S63 transmitted through the first drive signal line SI1 are applied to the memory block MB3. The drive signals GS, SS, S0~S63 may be provided to gates of select transistors SST and GST and memory cells of the memory block MB3.

In the case that the memory block MB1 is selected, the block select line BLKWL5 is activated. When the block select line BLKWL5 is activated, all the pass transistors of the pass transistor array 230 disposed on the right of the memory blocks MB0 and MB1 are turned on. At this time, drive signals GS, SS, S0~S63 transmitted through the first drive signal line SI1 are applied to the memory block MB1. The drive signals GS, SS, S0~S63 may be provided to gates of select transistors SST and GST and memory cells of the memory block MB1.

In the case that the memory block MB2 is selected, the block select line BLKWL6 is activated. When the block select line BLKWL6 is activated, all the pass transistors of the pass transistor array 240 disposed on the right of the memory blocks MB2 and MB3 are turned on. At this time, drive signals GS, SS, S0~S63 transmitted through the first drive signal line SI1 are applied to the memory block MB2. The drive signals GS, SS, S0~S63 may be provided to gates of select transistors SST and GST and memory cells of the memory block MB2.

Herein, the pass transistor arrays 210 and 220 are formed on the left of the memory blocks MB0 and MB1 and the pass transistor arrays 230 and 240 are formed on the right of the memory blocks MB2 and MB3. A chip area occupied by the pass transistors is greater than area occupied by the memory block. Thus, it is desirable to form the pass transistor arrays on both sides of the memory blocks to provide the pass transistor array with respect to each of the memory blocks occupying a relatively small area.

The pass transistor arrays 210, 220, 230 and 240 may each form at least two pass transistors corresponding to different memory blocks on one active region. Thus, a channel length required to form the pass transistors may be relatively reduced. These technical features will be described next.

Figure 5:
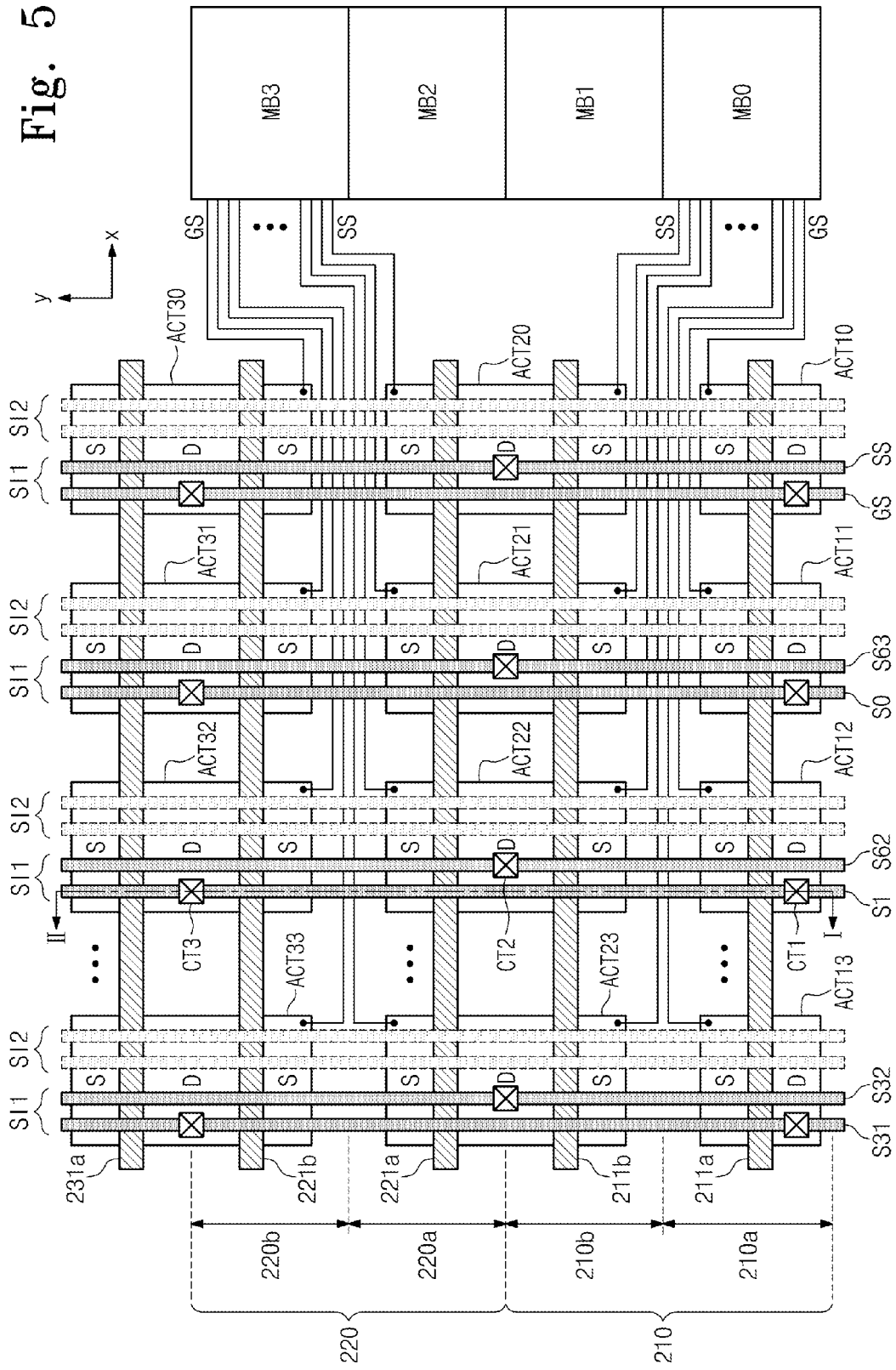
FIG. 5 is a drawing illustrating a layout structure of pass transistors disposed at one side of FIG. 4.

FIG. 5 is a drawing illustrating a layout pattern of pass transistors arrays 210 and 220 of FIG. 4. Referring to FIG. 5, the pass transistor array 210 for selecting the memory block MB0 is formed on the left of the memory blocks MB0 and MB1. Also, the pass transistor array 220 for selecting the memory block MB3 is formed on the left of the memory blocks MB2 and MB3.

The pass transistor array 210 is formed on a high voltage region of the left of the two memory blocks MB0 and MB1. The pass transistor array 210 is comprised of two pass transistor groups 210a and 210b. The pass transistors 210a are disposed on a lower side of a y direction and the pass transistors 210b are disposed on an upper side of a y direction. Pass transistors 210a disposed on a lower side of a y direction transmit a ground select signal GS and word line drive signals S0~S31 transmitted through the first drive signal line SI1 to the memory block MB0. Pass transistors 210b disposed on an upper side of a y direction transmit a string select signal SS and word line drive signals S32~S63 provided through the first drive signal line SI1 to the memory block MB0.

In the pass transistor array 210, each of the pass transistors 210a disposed on a lower side of a y direction is formed to be one high voltage transistor in one active region. Pass transistors 210b are formed in a different shape from the pass transistors 210a. That is, each of the pass transistors 210b disposed on an upper side of a y direction is one of two high voltage transistors formed in one active region.

Each of the pass transistors 210a is formed to be one high voltage transistor in one active region. Each of the pass transistors 210a is formed to have one source S and one drain D in one active region. A plurality of active regions ACT10~ACT13 sequentially formed in an x direction is formed to form high voltage transistors 210a transmitting a ground select signal GS and word line drive signals S0~S31 to the memory block MB0. One gate line 211a is formed in an x direction on the plurality of active regions ACT10~ACT13. Drive signal lines SI1 and SI2 including metal are formed on the gate line 211a along a y direction.

A ground select line (GS line) of the first drive signal line SI1 is connected to a drain D of the active region ACT10 by a contact plug. Another metal line for transmitting the ground select signal GS to the memory block MB0 is connected to a source S of the active region ACT10. In this manner, a high voltage transistor transmitting the ground select signal GS is formed.

A drive signal line (S0 line) of the first drive signal line SI1 is connected to a drain D of the active region ACT11 by a contact plug. Another metal line for transmitting the drive signal S0 to the memory block MB0 is connected to a source S of the active region ACT11. In this manner, a high voltage transistor transmitting the drive signal S0 is formed.

A drive signal line (S1 line) of the first drive signal line SI1 is connected to a drain D of the active region ACT12 by a contact plug. Another metal line for transmitting the drive signal S1 to the memory block MB0 is connected to a source S of the active region ACT12. In this manner, a high voltage transistor transmitting the drive signal S1 is formed.

A drive signal line (S31 line) of the first drive signal line SI1 is connected to a drain D of the active region ACT13 by a contact plug. Another metal line for transmitting the drive signal S31 to the memory block MB0 is connected to a source S of the active region ACT13. In this manner, a high voltage transistor transmitting the drive signal S31 is formed. The connection relation is equally applied to other pass transistors included in the pass transistors 210a.

Each of the pass transistors 210b is one of two high voltage transistors formed in one active region. That is, a high voltage transistor is formed in the form that one drain D and two sources S are included in one active region. High voltage transistors for transmitting the string select signal SS and the word line drive signals S32~S63 to the memory block MB0 may be formed in each of the active regions ACT20~ACT23. Also, high voltage transistors for transmitting the string select signal SS and the word line drive signals S32~S63 to the memory block MB3 may be formed in each of the active regions ACT20~ACT23.

On the active region ACT20, a common gate line 211b of the pass transistors 210b and a common gate line 221a of the pass transistors 220a are formed along an x direction. On the common gate lines 211b and 221a, the first drive signal line SI1 and the second drive signal line SI2 are formed in parallel to each other along a y direction. A string select line (SS line) of the first drive signal line SI1 is connected to a drain D corresponding to the center of the active region ACT20 by a contact plug. Another metal line for transmitting the string select signal SS to the memory block MB0 is connected to the lower source S of the active region ACT20. Also, another metal line for transmitting the string select signal SS to the memory block MB3 is connected to the upper source S of the active region ACT20. In this manner, two pass transistors transmitting the string select signal SS are formed on the one active region ACT20.

On the active region ACT21, the common gate line 211b of the pass transistors 210b and the common gate line 221a of the pass transistors 220a are formed in parallel to each other along an x direction. On the common gate lines 211b and 221a, the first drive signal line SI1 and the second drive signal line SI2 are formed in parallel to each other along a y direction. A drive signal line (S63 line) of the first drive signal line SI1 is connected to a drain D corresponding to the center of the active region ACT21 by a contact plug. Another metal line for transmitting the drive signal S63 to the memory block MB0 is connected to the lower source S of the active region ACT21. Also, another metal line for transmitting the drive signal S63 to the memory block MB3 is connected to the upper source S of the active region ACT21. In this manner, two pass transistors transmitting the drive signal S63 to the memory blocks MB0 and MB3 respectively are formed in one active region ACT21.

On the active region ACT22, the common gate line 211b of the pass transistors 210b and the common gate line 221a of the pass transistors 220a are formed in parallel to each other along an x direction. On the common gate lines 211b and 221a, the first drive signal line SI1 and the second drive signal line SI2 are formed in parallel to each other along a y direction. A drive signal line (S62 line) of the first drive signal line SI1 is connected to a drain D corresponding to the center of the active region ACT22 by a contact plug. Another metal line for transmitting the drive signal S62 to the memory block MB0 is connected to the lower source S of the active region ACT22. Also, another metal line for transmitting the drive signal S62 to the memory block MB3 is connected to the upper source S of the active region ACT22. In this manner, two pass transistors transmitting the drive signal S62 to the memory blocks MB0 and MB3 respectively are formed in one active region ACT22.

A drive signal line (S32 line) of the first drive signal line SI1 is connected to a drain D corresponding to the center of the active region ACT23 by a contact plug. Another metal line for transmitting the drive signal S32 to the memory block MB0 is connected to the lower source S of the active region ACT23. Also, another metal line for transmitting the drive signal S32 to the memory block MB3 is connected to the upper source S of the active region ACT23. In this manner, two pass transistors transmitting the drive signal S32 to the memory blocks MB0 and MB3 respectively are formed in one active region ACT23.

By the method described above, one pass transistor array 210 may be formed in a width D corresponding to two memory blocks. Although not illustrated in the drawing, the gate lines 211a and 211b should be electrically connected so that the block select signal BLKWL1 is equally provided to the gate lines 211a and 211b. If the block select signal BLKWL1 is activated, channels are formed in the active regions and the pass transistors 210a and 210b are turned on.

Each of the pass transistors 220b constituting the pass transistor array 220 is one of two high voltage transistors formed in one active region. That is, a high voltage transistor may be formed in the form that one source S and two drains D are formed in one active region. High voltage transistors for transmitting the ground select signal GS and the word line drive signals S0~S31 to the memory block MB3 may be formed in the active regions ACT30~ACT33. Also, high voltage transistors for transmitting the ground select signal GS and the word line drive signals S0~S31 to a memory block MB4 may be formed in the active regions ACT30~ACT33.

On the active region ACT30, a common gate line 221b of the pass transistors 220b and a common gate line 231a of the pass transistors 230a are formed along an x direction. On the common gate lines 221b and 231a, the first drive signal line SI1 and the second drive signal line SI2 are formed in parallel to each other along a y direction. A ground select line (GS line) of the first drive signal line SI1 is connected to a drain D corresponding to the center of the active region ACT30 by a contact plug. Another metal line for transmitting the ground select signal GS to the memory block MB3 is connected to the lower source S of the active region ACT30. Also, another metal line for transmitting the ground select signal GS to the memory block MB4 is connected to the upper source S of the active region ACT30. In this manner, two pass transistors transmitting the ground select signal GS are formed on the one active region ACT30.

Although different drive signals are applied to the active regions ACT31~ACT33, two high voltage transistors are formed in each of the active regions ACT31~ACT33 in the same method as the two high transistors formed in the active region ACT30. By the method described above, one pass transistor array 220 may be formed in a width D corresponding to two memory blocks. Although not illustrated in the drawing, the gate lines 221a and 221b should be electrically connected so that the block select signal BLKWL2 is equally provided to the gate lines 221a and 221b. If the block select signal BLKWL2 is activated, channels are formed in the active regions and the pass transistors 220a and 220b are turned on.

As described above, at least two high voltage transistors may be formed in one active region. Thus, sufficient high voltage transistors may be formed in few active regions. As a result, a space between active regions can be increased and a distance between block select signals can be increased. Also, since a size of high voltage transistor can also be reduced when a size of memory block is reduced, a layout of the pass transistors may be more flexibly provided over a change of design rule.

Figure 6:
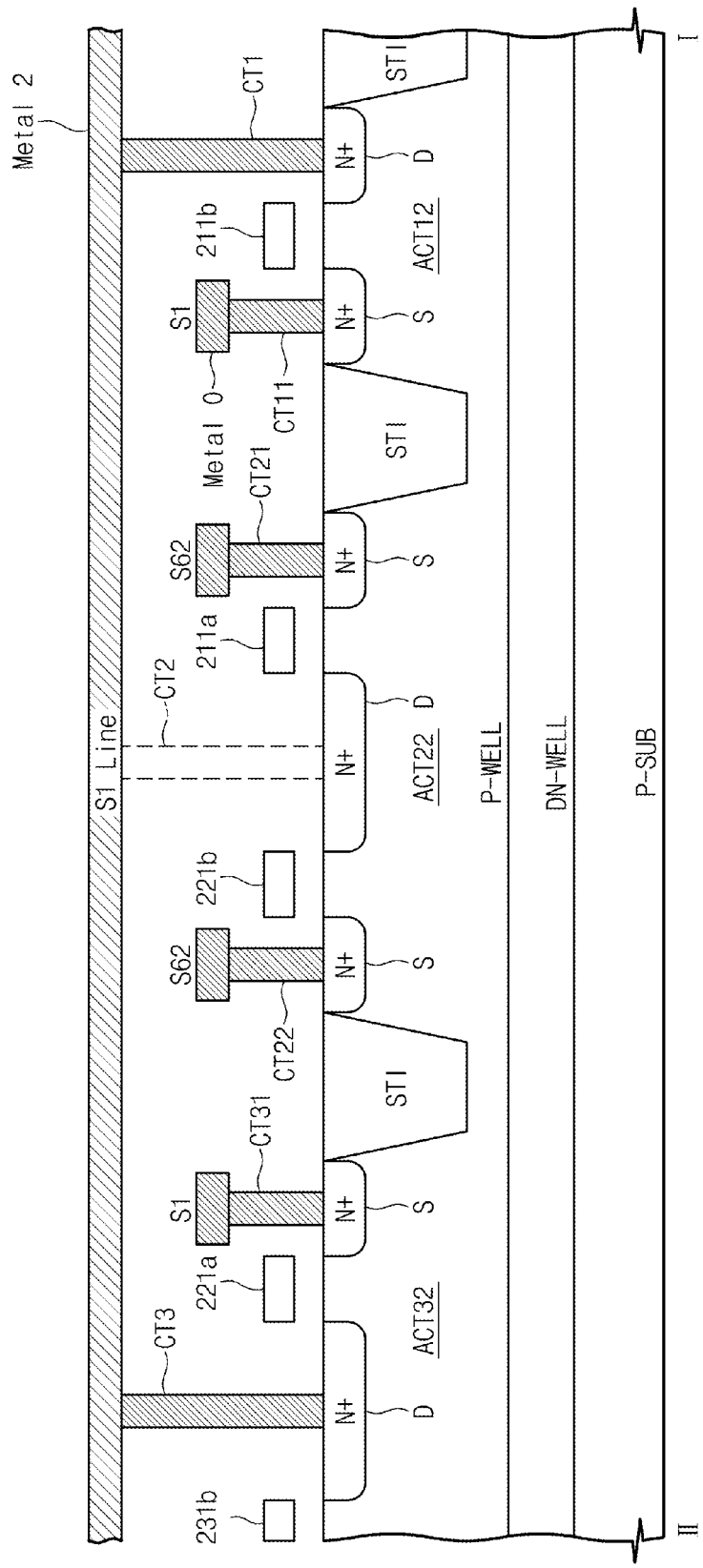
FIG. 6 is a cross sectional view taken along line I-II of FIG. 5.

FIG. 6 is a cross sectional view taken along the line I-II of FIG. 5.

Referring to FIG. 6, to form high voltage transistors, a deep N-well (DN-WELL) is formed on a substrate (P-SUB). A P-well (P-WELL) is formed on the deep N-well (DN-WELL). Active layers are formed in the P-well (P-WELL) by N-type dopants. Gate lines 211a, 211b, 221a and 221b corresponding to a gate of the pass transistor are formed on the active layers. A contact plug CT1 for connecting the first drive signal line (S1 line) which is a metal line (Metal 2) and the active layer is formed. On a source of the active region ACT12, a contact plug CT11 for connecting the source to another metal line (e.g., Metal 0) transmitting the drive signal S1 to the memory block MB0 may be formed. A pass transistor may be turned on or turned off depending on a level of the block select signal BLKWL1 applied to the gate line 211b.

A contact plug CT2 for connecting the drive signal line (S62 line) and the active region ACT22 is formed. On a source of the active region ACT22, a contact plug CT21 for connecting the source to another metal line (e.g., Metal 0) transmitting the drive signal S62 to the memory block MB0 may be formed. On another source of the active region ACT22, a contact plug CT22 for connecting the source to another metal line (e.g., Metal 0) transmitting the drive signal S62 to the memory block MB3 may be formed.

A contact plug CT3 for connecting the drive signal line (S1 line) and the active region ACT32 which is a metal line is formed. On a source of the active region ACT32, a contact plug CT31 for connecting the source to another metal line (e.g., Metal 0) transmitting the drive signal S1 to the memory block MB3 may be formed. Although not illustrated in the drawing, on the other side of the active region ACT32, a contact plug for connecting the other side to another metal line (e.g., Metal 0) transmitting the drive signal S1 to a memory block MB4.

As described above, two high voltage transistors can be formed in the active region ACT32. Thus, according to the layout structure of the inventive concept, a space of the active region for forming high voltage transistors may be obtained.

Figure 7:
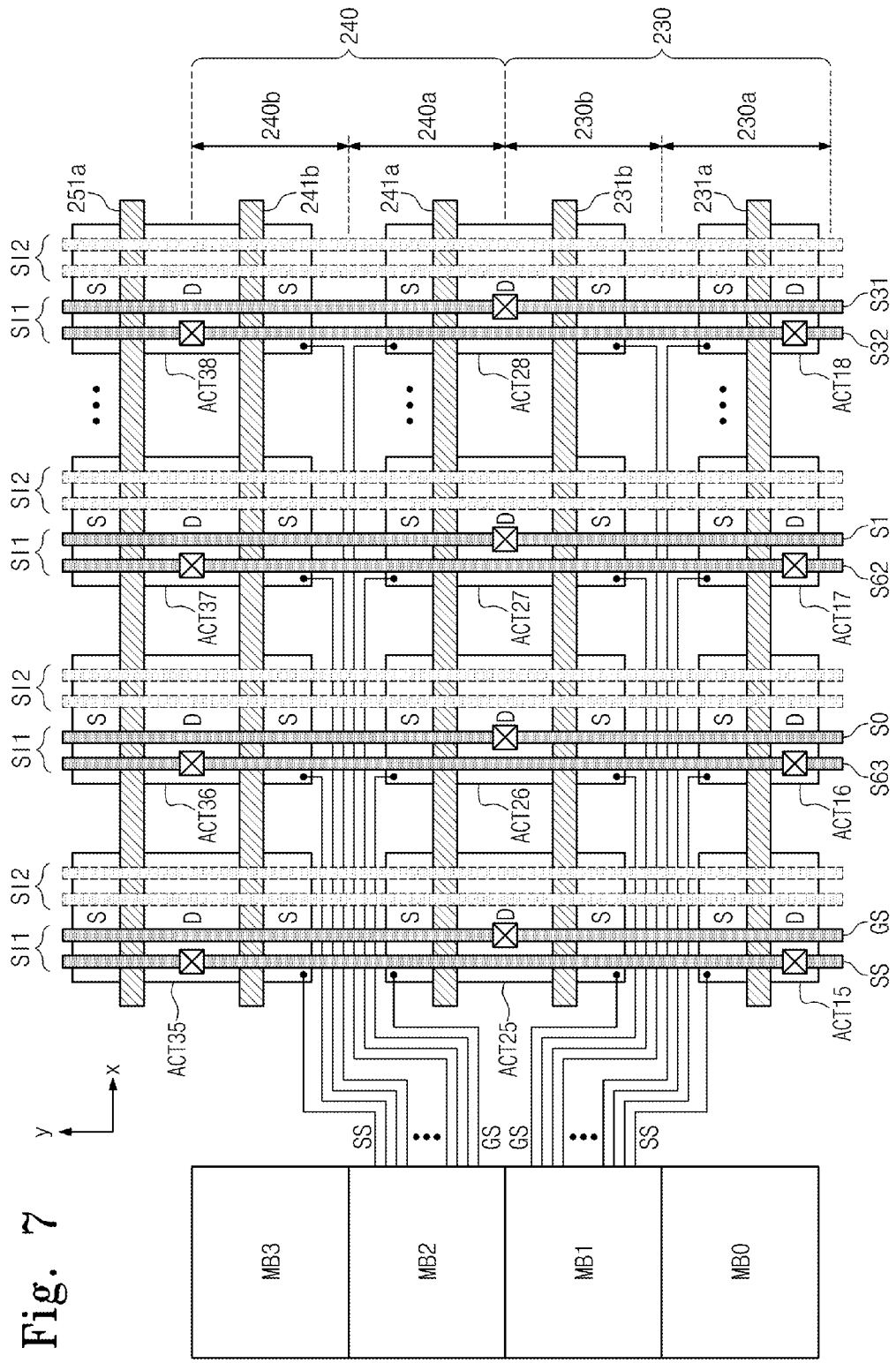
FIG. 7 is a drawing illustrating a layout structure of pass transistors disposed at the other side of FIG. 4.

FIG. 7 is a drawing illustrating a layout pattern of pass transistor arrays 230 and 240 of FIG. 4. Referring to FIG. 7, the pass transistor array 230 for selecting the memory block MB1 is formed on the right of the memory blocks MB0 and MB1. Also, the pass transistor array 240 for selecting the memory block MB2 is formed on the right of the memory blocks MB2 and MB3.

The pass transistor array 230 is formed in a right high voltage region of the two memory blocks MB0 and MB1. The pass transistor array 230 is comprised of two pass transistor groups depending on a position. That is, the pass transistor array 230 may be comprised of pass transistors 230a disposed at a lower portion of a y direction and pass transistors 230b disposed at an upper portion of a y direction. The pass transistors 230a transmit the string select signal SS and the word line drive signals S32~S63 provided through the first drive signal line SI1 to the memory block MB1. The pass transistors 230b transmit the ground select signal GS and the word line drive signals S0~S31 provided through the first drive signal line SI1 to the memory block MB1.

In the pass transistor array 230, each of the pass transistors 230a is one high voltage transistor formed in one active region and each of the pass transistors 230b is one of two high transistors formed in one active region.

A plurality of active regions ACT15~ACT18 are sequentially formed in an x direction to form the high voltage transistors 230a transmitting the string select signal SS and the ground select signal GS to the memory block MB1. One gate line 231a is formed on the active regions ACT15~ACT18 along an x direction. Drive signal lines SI1 and SI2 are formed on the gate line 231a along a y direction. Herein, since the drive signal line SI2 is electrically separated from the high voltage transistors 230a, 230b, 240a and 240b, the description of the drive signal line SI2 is omitted.

A string select line (SS line) of the first drive signal line SI1 is connected to a drain D of the active region ACT15 by a contact plug. Another metal line for transmitting the string select line SS to the memory block MB1 is connected to a source S of the active region ACT15. In this manner, one high voltage transistor transmitting the string select signal SS is formed.

A drive signal line (S63 line) of the first drive signal line SI1 is connected to a drain D of the active region ACT16 by a contact plug. Another metal line for transmitting the drive signal S63 to the memory block MB1 is connected to a source S of the active region ACT16.

High voltage transistors 230a are each formed to have one source S and one drain D in one active region by the method described above. This method is applied to the case that high voltage transistors are not formed any more at a lower portion of a y direction. In addition, a structure of high voltage transistor that one source S and one drain are formed in one active region is applied to a region in which a change from the drive signal lines SI1 to SI2 is made.

The high voltage transistors 230b for transmitting half (GS, S0~S31) of the drive signals being applied to the memory block MB1 are formed as follows. A plurality of active regions ACT25~ACT28 is formed in a right pass transistor region of the memory blocks MB1 and MB2 along an x direction. A quantity of the active regions ACT25~ACT28 corresponds to a quantity of the drive signals (GS, S0~S31) being applied to the memory block MB1. The drive signal lines SI1 and SI2 which are metal line (e.g., Metal 2) are formed on the gate line 231b along a y direction. The gate line 231b constitutes high voltage transistors 230b for transmitting the ground select signal GS and the word line drive signals S0~S31 to the memory block MB1. The gate line 241a constitutes high voltage transistors 240a for transmitting the ground select signal GS and the word line drive signals S0~S31 to the memory block MB2.

The ground select line GS of the first drive signal line SI1 is connected to a drain D corresponding to the center of the active region ACT25 by a contact plug. Another metal line (e.g., Metal 0 or Metal 1) for transmitting the ground select signals GS to the memory block MB1 or the memory block MB2 is connected to sources S of the active region ACT25. In this manner, high voltage transistors transmitting the ground select signal GS to the memory block MB1 or MB2 are formed.

The drive signal line (S0 line) of the first drive signal line SI1 is connected to a drain D of the active region ACT26 by a contact plug. Another metal line (e.g., Metal 0 or Metal 1) for transmitting the drive signal S0 to the memory block MB1 or the memory block MB2 is connected to sources S of the active region ACT26. In this manner, high voltage transistors transmitting the drive signal S0 to the memory block MB1 or MB2 are formed.

High voltage transistors 230b and 240a are formed to have one drain D and two sources S in one active region by the method described above. The method of forming a high voltage transistor is a method of forming pass transistors connected to a same drive signal line (e.g., SI1) formed inside the interface region.

One pass transistor array 230 may be formed in a width D corresponding to two memory blocks. At this time, although not illustrated in detail, the gate lines 231a and 231b should be electrically connected so that the block select signal BLKWL5 is equally provided to the gate lines 231a and 231b. If the block select signal BLKWL5 is activated, a channel is formed in the active regions and the pass transistors 230a and 230b are turned on. Also, the gate lines 241a and 241b should be electrically connected so that the block select signal BLKWL6 is equally provided to the gate lines 241a and 241b. If the block select signal BLKWL6 is activated, a channel is formed in the active regions and the pass transistors 240a and 240b are turned on.

As described above, at least two high voltage transistors may be formed in one active region. Thus, a required number of high voltage transistors may be formed in fewer active regions. As a result, a space between active regions can be increased and a distance between block select signals can be increased. Also, since a size of high voltage transistor can also be reduced when a size of memory block is reduced, a layout of the pass transistors may be more flexibly provided in response to a change of design rule.

Figure 8:
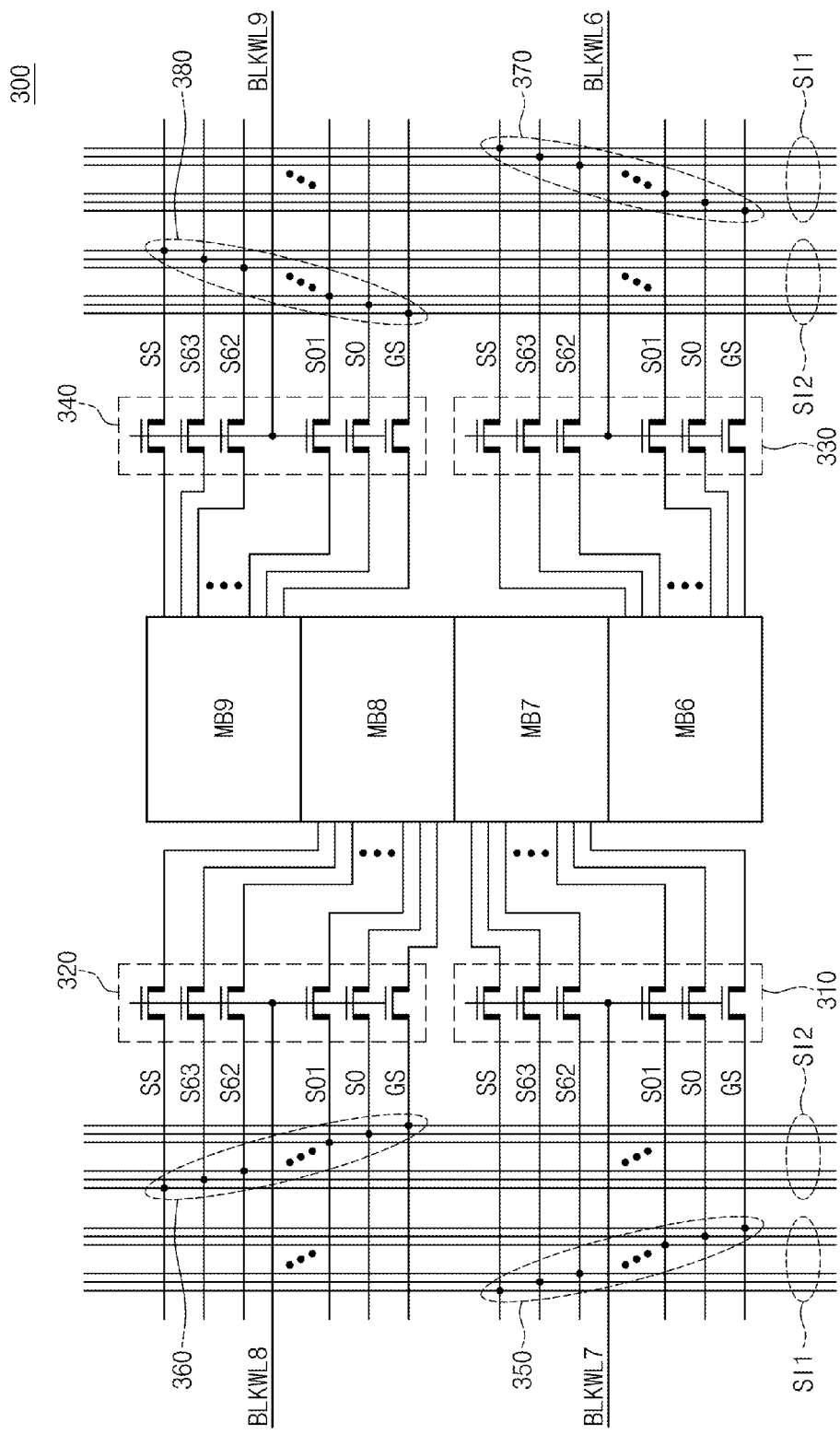
FIG. 8 is a drawing illustrating another part of FIG. 3.

FIG. 8 is a circuit diagram illustrating a connection relation between the first and second drive lines (SI1,SI2) and the pass transistor arrays to select the memory blocks MB6~MB9 of FIG. 3. Referring to FIG. 8, the first drive signal SI1 may be transmitted to the memory blocks MB6~MB9 through a plurality of pass transistors 310, 320, 330 and 340. A detailed description thereof follows next.

In the case that the memory block MB6 is selected, the block select line BLKWL6 is activated. When the block select line BLKWL6 is activated, the all the pass transistors included in the pass transistor array 330 are turned on. At this time, drive signals GS, SS, S0~S63 transmitted through the first drive signal line SI1 are applied to the memory block MB6 by connection points 370. The drive signals GS, SS, S0~S63 may be provided to gates of select transistors SST and GST and memory cells of the memory block MB6.

In the case that the memory block MB7 is selected, the block select line BLKWL7 is activated. When the block select line BLKWL7 is activated, the all the pass transistors included in the pass transistor array 310 are turned on. At this time, drive signals GS, SS, S0~S63 transmitted through the first drive signal line SI1 are applied to the memory block MB7 by connection points 350. The drive signals GS, SS, S0~S63 may be provided to gates of select transistors SST and GST and memory cells of the memory block MB7.

In the case that the memory block MB8 is selected, the block select line BLKWL8 is activated. When the block select line BLKWL8 is activated, all the pass transistors included in the pass transistor array 320 are turned on. At this time, drive signals GS, SS, S0~S63 transmitted through the second drive signal line SI2 are applied to the memory block MB8 by connection points 360. The drive signals GS, SS, S0~S63 may be provided to gates of select transistors SST and GST and memory cells of the memory block MB8.

In the case that the memory block MB9 is selected, the block select line BLKWL9 is activated. When the block select line BLKWL9 is activated, all the pass transistors included in the pass transistor array 340 disposed are turned on. At this time, drive signals GS, SS, S0~S63 transmitted through the second drive signal line SI2 are applied to the memory block MB8 by connection points 360. The drive signals GS, SS, S0~S63 may be provided to gates of select transistors SST and GST and memory cells of the memory block MB8.

Herein, the pass transistor arrays 310 and 320 are formed on the left of the memory blocks MB6~MB9 and the pass transistor arrays 330 and 340 are formed on the right of the memory blocks MB6~MB9. A chip area occupied by the pass transistors is greater than an area occupied by the memory block. Thus, it is desirable to form the pass transistor arrays on both sides of the memory blocks to provide the pass transistor array with respect to each of the memory blocks occupying relatively small area.

The pass transistor arrays 310 and 330 transmit the drive signals GS, SS, S0~S63 of the first drive signal line SI1 to the corresponding memory blocks MB6 and MB7 respectively. The pass transistor arrays 320 and 340 transmit the drive signals GS, SS, S0~S63 of the second drive signal line SI2 to the corresponding memory blocks MB8 and MB9 respectively. The pass transistor arrays 310 and 320 corresponding to an interface region in which a change from the drive signal line SI1 to the drive signal line SI2 is made may include high voltage transistors that one source S and one drain D are formed in one active region.

Figure 9:
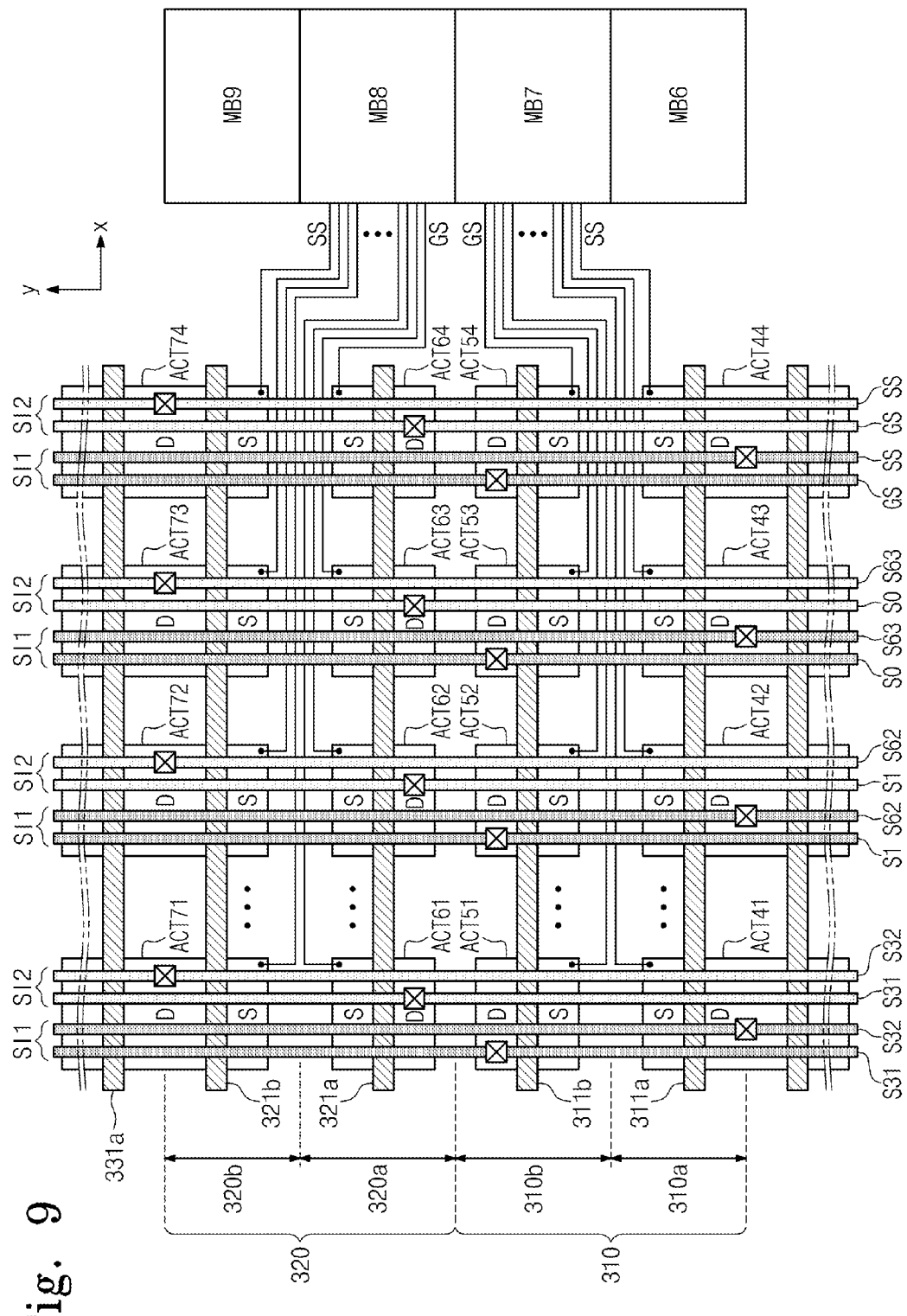
FIG. 9 is a drawing illustrating a layout structure of pass transistors disposed at one side of FIG. 8.

FIG. 9 is a drawing illustrating a layout structure of pass transistors disposed at one side of FIG. 8. Referring to FIG. 9, the pass transistor array 310 for selecting the memory block MB7 is formed on the left of the memory blocks MB6 and MB7. Also, the pass transistor array 320 for selecting the memory block MB8 is formed on the left of the memory blocks MB8 and MB9.

The pass transistor array 310 is formed on a high voltage region of the left of the two memory blocks MB6 and MB7. The pass transistor array 310 is comprised of two pass transistor groups 310a and 310b. The pass transistors 310a are disposed on a lower side of a y direction and the pass transistors 310b are disposed on an upper side of a y direction. Pass transistors 310a disposed on a lower side of a y direction transmit a string select signal SS and word line drive signals S32~S63 transmitted through the first drive signal line SI1 to the memory block MB7. Pass transistors 310b disposed on an upper side of a y direction transmit a ground select signal GS and word line drive signals S0~S31 transmitted through the first drive signal line SI1 to the memory block MB7.

The pass transistors 310a are formed to have one drain D and two sources S in one active region. That is, the pass transistors 310a for transmitting the string signal SS and the word line drive signals S32~S63 to the memory block MB7 are formed in each of active regions ACT41, ACT42, ACT43 and ACT44. Also, although not illustrated, pass transistors for transmitting the string select signal SS and word line drive signals S32~S63 to the memory block MB5 may be included in each of the active regions ACT41, ACT42, ACT43 and ACT44.

Each of the high voltage transistors 310b is formed to be one transistor in one active region. A plurality of active regions ACT51~ACT54 sequentially formed in an x direction is formed to form high voltage transistors 310b transmitting the ground select signal GS and the word line drive signals S0~S31 to the memory block MB7. One gate line 311b is formed on the plurality of active regions ACT51~ACT54 along an x direction. Drive signal lines SI1 and SI2 including metal are formed on the gate line 311b along a y direction.

The drive signal line (S31 line) of the first drive signal line SI1 is connected to a drain D of the active region ACT51 by a contact plug. Another metal line for transmitting the drive signal S31 to the memory block MB7 is connected to sources S of the active region ACT51. In this manner, one high voltage transistor transmitting the drive signal S31 to the memory block MB7 is formed.

The drive signal line (S1 line) of the first drive signal line SI1 is connected to a drain D of the active region ACT52 by a contact plug. Another metal line for transmitting the drive signal S1 to the memory block MB7 is connected to sources S of the active region ACT52.

High voltage transistors 310b are formed to have one drain D and one source S in one active region. This is because the high voltage transistors 320a disposed on an upper side of the high voltage transistors 310b are connected to the second drive signal SI2.

The pass transistor array 320 connects the second drive signal line SI2 to the memory block MB8. Each of the high voltage transistors 320a is formed to be one high voltage transistor in one active region. A plurality of active regions ACT61~ACT64 sequentially formed in an x direction is formed to form high voltage transistors 320a transmitting the ground select signal GS and the word line drive signals S0~S31 to the memory block MB8. One gate line 321a is formed on the plurality of active regions ACT61~ACT64 along an x direction. Drive signal lines SI1 and SI2 including metal are formed on the gate line 321a along a y direction.

The drive signal line (S31 line) of the second drive signal line SI2 is connected to a drain D of the active region ACT61 by a contact plug. Another metal line (e.g., Metal 0 or Metal 1) for transmitting the drive signal S31 to the memory block MB8 is connected to sources S of the active region ACT61. In this manner, one high voltage transistor transmitting the drive signal S31 to the memory block MB8 is formed.

The drive signal line (S1 line) of the second drive signal line SI2 is connected to a drain D of the active region ACT62 by a contact plug. Another metal line for transmitting the drive signal S1 to the memory block MB8 is connected to sources S of the active region ACT62.

High voltage transistors 320a are formed to have one drain D and one source S in one active region. This is because the high voltage transistors 310b disposed on a lower side of the high voltage transistors 320a are connected to the first drive signal SI1.

The pass transistor array 320 includes the pass transistors 320b disposed on an upper portion of a y direction. The pass transistors 320b disposed on an upper portion of a y direction transmit the string select signal SS and word line drive signals S32~S63 transmitted through the second drive signal line SI2 to the memory block MB8. The pass transistors 320b are formed to have one drain D and two sources S in one active region. That is, the pass transistors 320b for transmitting the string signal SS and the word line drive signals S32~S63 to the memory block MB8 may be formed in the active regions ACT71, ACT72, ACT73 and ACT74. Also, although not illustrated, high voltage transistors for transmitting the string signal SS and the word line drive signals S32~S63 to the memory block MB11 may be included in the active regions ACT71, ACT72, ACT73 and ACT74.

As described above, each of the high voltage transistors 310b and 320a formed in an interface region that a change of the drive signal lines SI1 and SI2 is made is formed to be one transistor in one active region. Most of the high voltage transistors formed outside the interface region may each be formed to be two transistors in one active region. Thus, a spacing between high voltage transistors may be improved.

Figure 10:
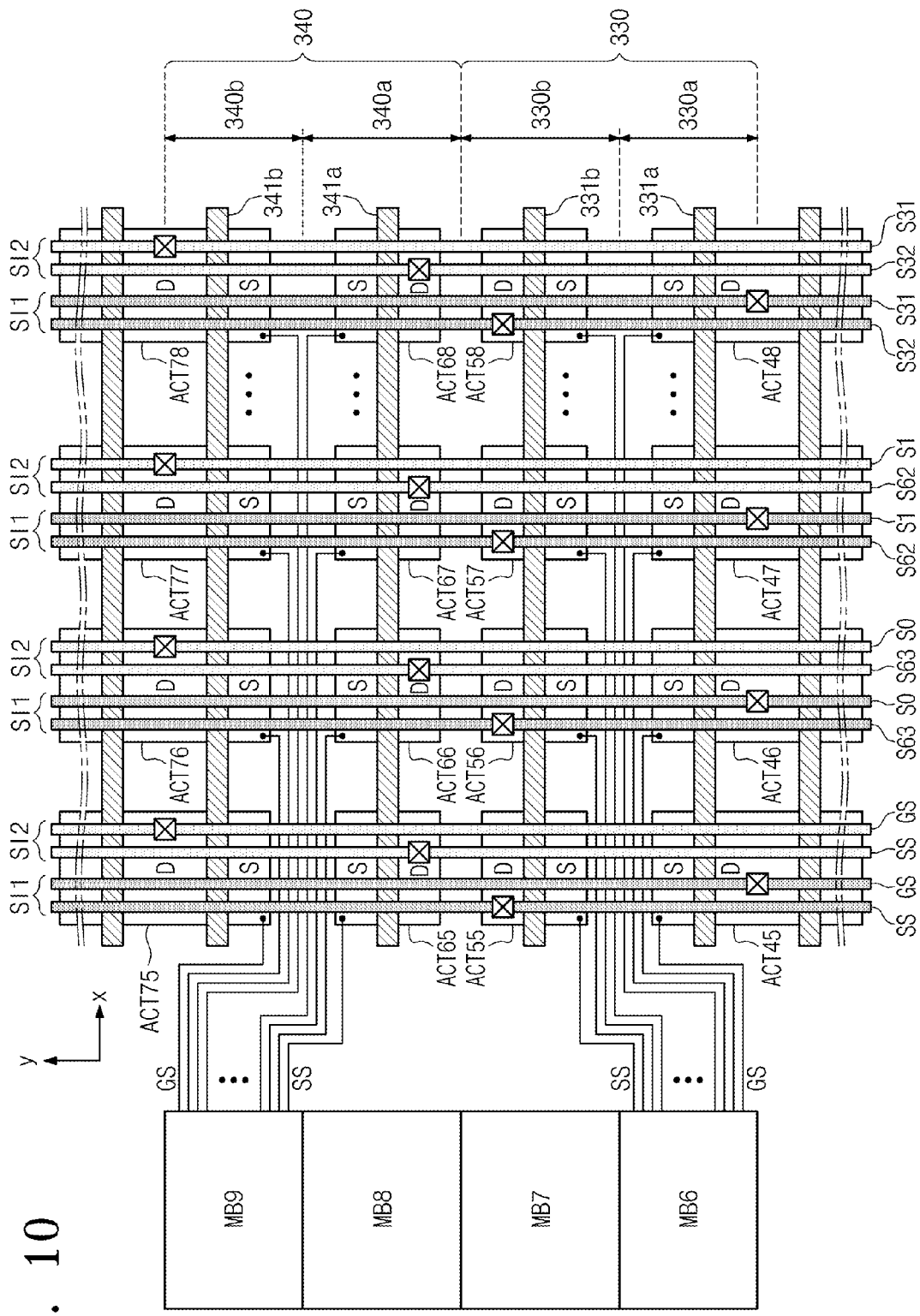
FIG. 10 is a drawing illustrating a layout structure of pass transistors disposed at the other side of FIG. 8.

FIG. 10 is a drawing illustrating a layout structure of pass transistors disposed at the other side of FIG. 8. Referring to FIG. 10, the pass transistor array 330 for selecting the memory block MB8 is formed on the right of the memory block MB6 and the memory block MB7. Also, the pass transistor array 340 for selecting the memory block MB9 is formed on the right of the memory block MB8 and the memory block MB9.

The pass transistor array 330 is formed in a right high voltage region of the two memory blocks MB6 and MB7. The pass transistor array 330 is comprised of two groups 330a and 330b. The pass transistors 330a are disposed on a lower side of a y direction and the pass transistors 330b are disposed on an upper side of a y direction. Pass transistors 330a disposed on a lower side of a y direction transmit a ground select signal GS and word line drive signals S0~S31 transmitted through the first drive signal line SI1 to the memory block MB6.

The high voltage transistors 330a are formed to have one drain D and two sources S in one active region. That is, the high voltage transistors 330a for transmitting the ground select signal GS and the word line drive signals S0~S31 may be formed in the active regions ACT45, ACT46, ACT47 and ACT48. Also, although not illustrated, high voltage transistors for transmitting the ground select signal GS and the word line drive signals S0~S31 to the memory block MB5 may be included in the active regions ACT45, ACT46, ACT47 and ACT48.

Each of the high voltage transistors 330b is formed to be one transistor in one active region. A plurality of active regions ACT55~ACT58 sequentially formed in an x direction is formed to form high voltage transistors 330b transmitting the string select signal SS and the word line drive signals S32~S63 to the memory block MB6. One gate line 331b is formed on the plurality of active regions ACT55~ACT58 along an x direction. Drive signal lines SI1 and SI2 including metal are formed on the gate line 331b along a y direction.

The string select signal line (SS line) of the first drive signal line SI1 is connected to a drain D of the active region ACT55 by a contact plug. Another metal line for transmitting the string select signal SS to the memory block MB6 is connected to a source S of the active region ACT55. In this manner, a high voltage transistor transmitting the string select signal SS is formed.

The drive signal line (S63) of the first drive signal line SI1 is connected to a drain D of the active region ACT56 by a contact plug. Another metal line for transmitting the drive signal S63 to the memory block MB6 is connected to a source S of the active region ACT56.

High voltage transistors 330b are formed to have one drain D and one source S in one active region. This is because the high voltage transistors 340a disposed on an upper side of the high voltage transistors 330b are connected to the second drive signal line SI2.

The pass transistor array 340 connects the second drive signal line SI2 to the memory block MB9. Each of the high voltage transistors 340a is formed to be one high voltage transistor in one active region. A plurality of active regions ACT65~ACT68 sequentially formed in an x direction is formed to form high voltage transistors 340a transmitting the string select signal SS and the word line drive signals S32~S63 to the memory block MB9. One gate line 341a is formed on the plurality of active regions ACT65~ACT68 along an x direction. Drive signal lines SI1 and SI2 including metal are formed on the gate line 341a along a y direction.

The string select signal line SS of the second drive signal line SI2 is connected to a drain D of the active region ACT65 by a contact plug. Another metal line for transmitting the string select signal SS to the memory block MB9 is connected to sources S of the active region ACT65. In this manner, one high voltage transistor transmitting the string select signal SS to the memory block MB9 is formed.

The drive signal line S63 of the second drive signal line SI2 is connected to a drain D of the active region ACT66 by a contact plug. Another metal line for transmitting the drive signal S63 to the memory block MB9 is connected to sources S of the active region ACT66.

High voltage transistors 340a are formed to have one drain D and one source S in one active region. This is because the high voltage transistors 330b disposed on a lower side of the high voltage transistors 340a are connected to the first drive signal line SI1.

The pass transistors 340b disposed on an upper portion of a y direction transmit the ground select signal GS and word line drive signals S0~S31 transmitted through the second drive signal line SI2 to the memory block MB9. The pass transistors 340b are formed to have one drain D and two sources S in one active region. That is, the high transistors 340b for transmitting the ground signal GS and the word line drive signals S0~S31 to the memory block MB9 may be formed in the active regions ACT75, ACT76, ACT77 and ACT78. Also, although not illustrated, high voltage transistors for transmitting the ground signal GS and the word line drive signals S0~S31 to the memory block MB10 may be included in the active regions ACT75, ACT76, ACT77 and ACT78.

As described above, each of the high voltage transistors 330b and 340a formed in an interface region that a change of the drive signal lines SI1 and SI2 is made is formed to be one transistor in one active region. Most of the high voltage transistors formed outside the interface region may each be formed to be two transistors in one active region. Thus, a spacing between high voltage transistors may be improved.

Figure 11:
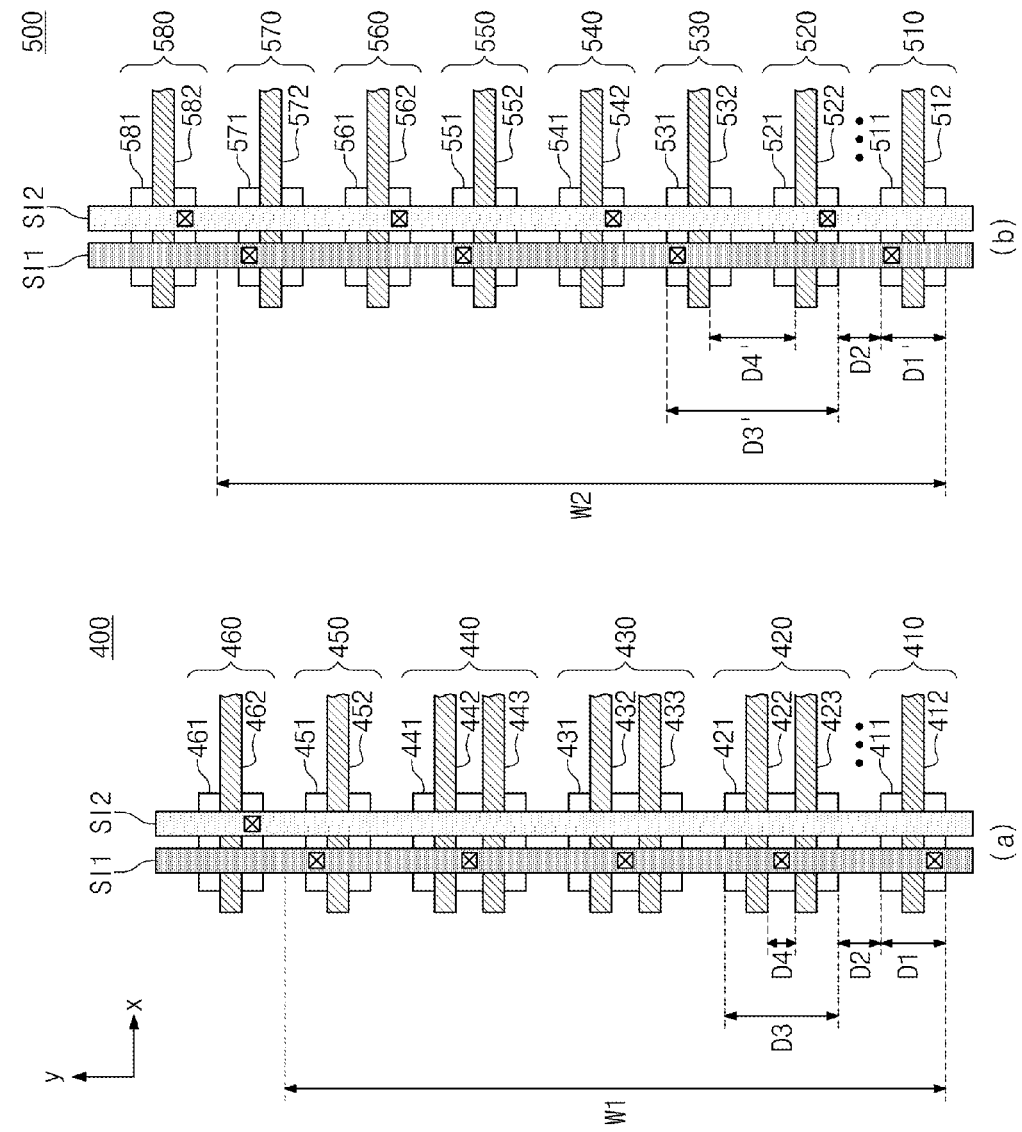
FIG. 11 is a drawing for use in describing a characteristic which may be achieved by the inventive concept.

FIG. 11 is a drawing illustrating an advantage of the inventive concept. In (a) of FIG. 11, pass transistors 400 applying the layout of the inventive concept are illustrated. In (b) of FIG. 11, each of pass transistors 500 formed to be one high voltage transistor in one active region is illustrated. Herein, a first drive signal line SI1 and a second drive signal line SI2 are illustrated to be one metal line respectively. However, this is for convenience of description. For example, the first drive signal line SI1 and the second drive signal line SI2 may be two metal lines respectively.

According to the pass transistors 400, more high voltage transistors may be formed in a same area along a y direction. This is because two high voltage transistors may be formed in each of the active regions 421, 431 and 441. A high voltage transistor (e.g., 410, 450 and 460) formed in an interface region is formed to be one high voltage transistor in one active region. However, two transistors may be formed in one active region to form high voltage transistors (e.g., 420, 430 and 440) formed outside the interface region. However, in the case of (b) of FIG. 11 that one transistor is formed in one active region, use of a space in a y direction may not be relatively effective.

According to embodiments of the inventive concept, in the transistor 410 formed in an interface region, a space in a y direction for forming one high voltage transistor is D1+D2. Herein, D1 is a y direction distance corresponding to an active region and D2 is a distance between transistors. This occupied space is equally applied to a high voltage transistor 510. That is, D1 and D1' may be equally set.

According to embodiments of the inventive concept, a width of a y direction of an active region of the two high voltage transistors 420 corresponds to D3. However, D3' which is a width that two high voltage transistors 520 and 530 formed in different active regions respectively occupy in a y direction is relatively great as compared with the D3. Consequently, in the case of constituting eight pass transistor arrays, according to embodiments of the inventive concept, a width of W1 in a y direction is needed. In contrast, in the case that one high voltage transistor is formed in one active region, a width of W2 in a y direction is needed.

Thus, in the case that a pass transistor array is formed by the layout method of the inventive concept, more pass transistors may be formed in a relatively small area. Also, this allows the pass transistor layout to accommodate in the case where a size of memory blocks is reduced by improvements in fabrication and the like.

Figure 12:
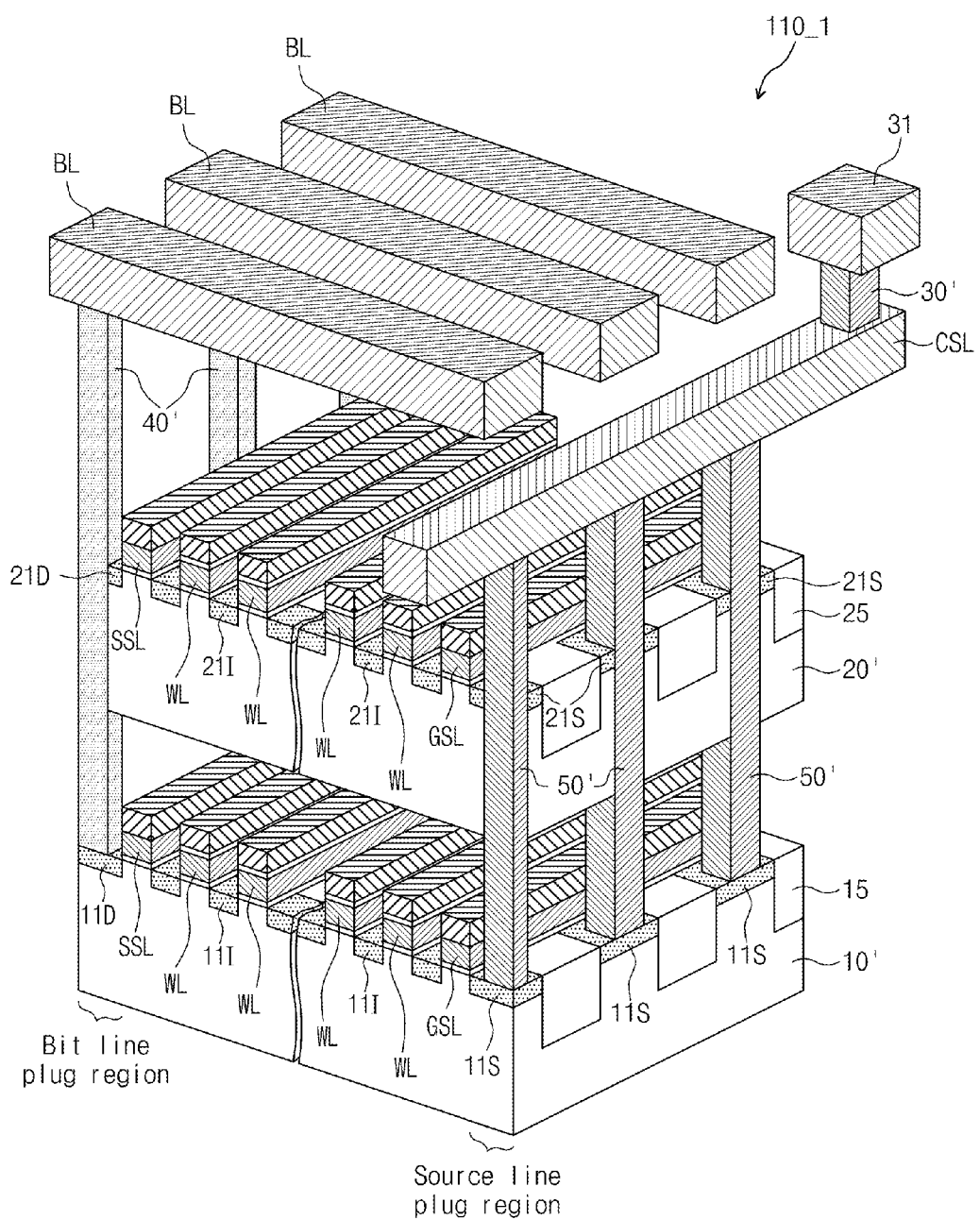
FIG. 12 is a drawing illustrating an embodiment of a memory cell array.

FIG. 12 is a drawing illustrating a memory cell array structure in accordance with an embodiment of the inventive concept. In FIG. 12, a cell array 110_1 of a stack flash structure is illustrated. Referring to FIG. 12, a flash memory device may include memory cells that are arranged in three dimensions. The memory cells may be formed on a plurality of stacked semiconductor layers used as a substrate for forming a MOS transistor.

In the embodiment, a first semiconductor layer 10' may be a single crystalline silicon wafer and a second semiconductor layer 20' may be a single crystalline silicon epitaxial layer formed through an epitaxial process using the first semiconductor layer 10' (i.e., wafer) as a seed layer. In the embodiment, the semiconductor layers 10' and 20' may each include a cell array having a substantially same structure and the memory cells may constitute a multilayer cell array 10_1.

The semiconductor layers 10' and 20' may each include active regions defined by device isolation layer patterns 15. The active regions may be formed in parallel to one another along a specific direction. The device isolation layer patterns 15 are formed of insulating materials including a silicon oxide layer and may electrically separate the active regions from one another.

On each of the semiconductor layers 10' and 20', a gate structure including a pair of select lines GSL and SSL and M quantity of word lines WL that cross the active regions may be disposed. Source plugs 50' are disposed on one side of the gate structure and bit line plugs 40' may be disposed on the other side of the gate structure. The bit line plugs 40' may be connected to N quantity of bit lines BL crossing the word lines WL respectively. At this time, the bit lines BL may be formed to cross the word lines WL on the uppermost semiconductor layer (for example, the second semiconductor layer 20' in FIG. 13). Herein, N which is the quantity of bit lines BL is an integer greater than 1 and may, for example, be a multiple of 8.

The word lines WL are disposed between the select lines GSL and SSL and M which is quantity of word lines WL is an integer greater than 1. The M may be one of multiples of 8. One of the select lines GSL and SSL may be used as a ground select line GSL controlling an electrical connection of a common source line CSL and memory cells. The other one of the select lines GSL and SSL may be used as a string select line SSL controlling an electrical connection of the bit lines and the memory cells.

Impurity regions may be formed between the select lines and the word lines. At this time, impurity regions 11S and 21S formed on one side of the ground select line GSL may be used as source electrodes connected by the common source line CSL and impurity regions 11D and 21D formed on one side of the string select line SSL may be used as drain electrodes connected to bit lines BL through the bit line plugs 40'. Also, impurity regions 111 and 211 formed on both side of the word lines WL may be used as internal impurity regions connecting the memory cells in series.

The source plugs 50' may electrically connect the impurity regions 11S and 21S to the semiconductor layers 10' and 20'. The impurity regions 11S and 21S (hereinafter it is referred to as first and second source regions) are formed in the first and second semiconductor layers 10' and 20' and are used as source electrodes. As a result, the first and second source regions 11S and 21S and the semiconductor layers 10' and 20' have the same electric potential. To achieve this, the source plugs 50' penetrate the second semiconductor layer 20' and the second source region 21S to be connected to the first source region 11S. At this time, the source plug 50' may be directly in contact with inner walls of the second semiconductor layer 20' and the second source region 21S.

Figure 13:
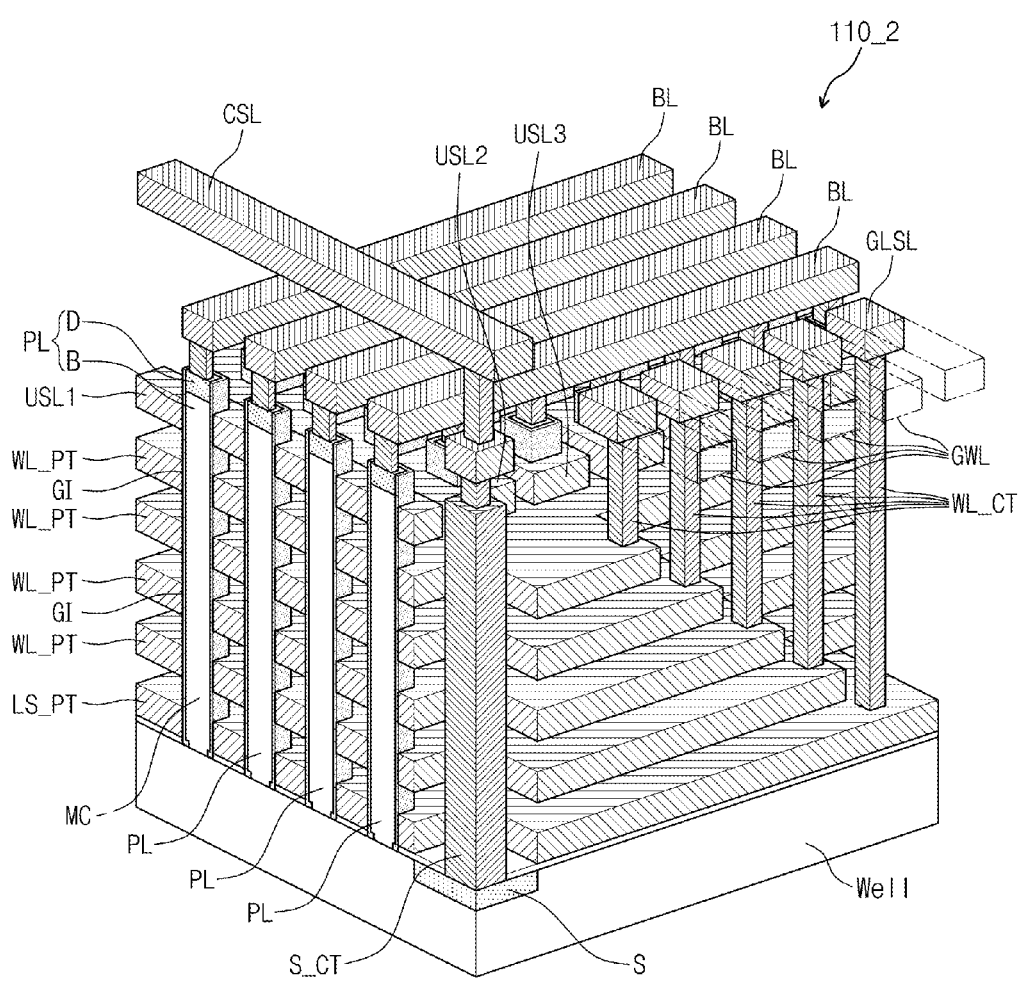
FIG. 13 is a drawing illustrating another embodiment of a memory cell array.

FIG. 13 is a drawing illustrating a memory cell array structure in accordance with another embodiment of the inventive concept. In FIG. 13, a cell array 110_2 of three-dimensional flash structure is illustrated. Referring to FIG. 13, the cell array 110_2 of flash memory may include a plurality of word line plates WL_PT electrically separated from one another and a plurality of active pillars PL (or active regions) arranged to cross the plurality of word line plates WL_PT. A semiconductor substrate may include a well region (Well) and a source region S. The source region S may be formed to have a different conductivity type from the well region (Well). For example, the well region (Well) may be formed from a p-type silicon and the source region S may be formed from an n-type silicon. In the embodiment, the well region (Well) is surrounded by at least one other well region having a different conductivity type from the well region (Well) and thereby the well region may have a pocket well structure or a triple well structure.

Each of the word line plates WL_PT may be comprised of a plurality of local word lines LWL electrically connected on a coplanar to have an equipotential. Each of the word line plates WL_PT may be electrically separated by an interlayer insulating layer (not illustrated). Each of the word line plates WL_PT may be connected to each of global word lines GWL electrically separated through word line contact plugs WL_CT. The word line contact plugs WL_CT may be formed at edges of a memory cell array or array blocks. An area of the word line plates WL_PT and a location at which the word line contact plugs WL_CT are disposed may be constituted in the various forms.

Each of the active pillars PL may include a body portion B adjacent to a well region (Well) and a drain region D adjacent to an upper select line USLi (i is an integer equal to or smaller than N). The body portion B may be formed to have the same conductivity type as the well region (Well) and the drain region D may be formed to have a different conductivity type from the well region (Well). A plurality of active pillars PL may have major axes penetrating the plurality of word line plates WL_PT. Connection points between the plurality of active pillars PL and the plurality of word line plates WL_PT may be distributed in three dimensions. That is, each of memory cells MC of three dimensional memories may be formed by the connection points distributed in three dimensions. A gate insulating layer GI may be disposed between the word line plate WL_PT and the active pillar PL. In the embodiment, the gate insulating layer GI may be a multilayer, for example, a laminated ONO. A part of the gate insulating layer may be used as a thin film (i.e., a charge storage film or a charge storage layer) to store information.

One ends of the active pillars PL may be commonly connected to the well region (Well) and the other ends of the active pillars PL may be connected to a plurality of bit lines BL. A plurality of (e.g., N quantity) active pillars PL may be connected to one bit line BL. Thus, a plurality of (e.g., N quantity) cell strings CSTR may be connected to one bit line BL. One active pillar PL may constitute one cell string CSTR. One cell string CSTR may include a plurality of memory cells MC formed in a plurality of word line plates WL_PT. One memory cell MC may be defined by one active pillar PL and one local word line LWL or one active pillar PL and the word line plate WL_PT.

One cell string CSTR (i.e., one active pillar PL) should be able to be independently selected so as to program each of the memory cells M and read the programmed data. To achieve this, a plurality of upper select lines USLi may be disposed between the bit lines BL and the uppermost word line plate WL_PT. The upper select lines USLi may be disposed to cross the bit lines BL. The bit lines BL may be electrically connected to a drain region D through a predetermined plug or may be directly in contact with the drain region D.

A plurality of upper select transistors controlling an electrical connection between a corresponding active pillar PL and a corresponding bit line BL may be formed in regions where a plurality of bit lines BL and a plurality of upper select lines USLi cross each other. A gate electrode USGi of the upper select transistor may be connected to the corresponding upper select line USLi. As a result, one active pillar PL (i.e., one cell string CSTR) may be independently selected by one bit line BL and one upper select line USLi.

As illustrated in FIG. 13, a source region S forming a charge path to/from the bit line BL may be formed in the well region (Well). The source region S may be electrically connected to the common source line CSL. A source contact plug S_CT penetrating the word line plates WL_PT may be interposed between the common source line CSL and the source region S. The common source line CSL may be disposed on the bit lines BL through the source contact plug S_CT and may include metal material. However, that is just one constitution example of the common source line CSL and other constitution forms of the common source line may be adopted.

A plurality of lower select lines LSL controlling an electrical connection between the active pillars PL and the well region (Well) may be disposed between the well region (Well) and the lowermost word line plate WL_PT. In the embodiment, the plurality of lower select lines LSL may constitute a lower select plate LS_PT having the same electric potential as the lower select line LSL. Each of the lower select lines LSL are connected to lower selection gates LSGi of corresponding lower select transistors respectively to control an electrical connection between corresponding active pillars PL and the well region (Well). The aforementioned voltage generating method of the inventive concept may also be applied to the flash memory having a three dimensional structure as described above. A negative word line voltage and a positive word line voltage may be applied to the word line plate of the flash memory illustrated in FIG. 14.

Figure 14:
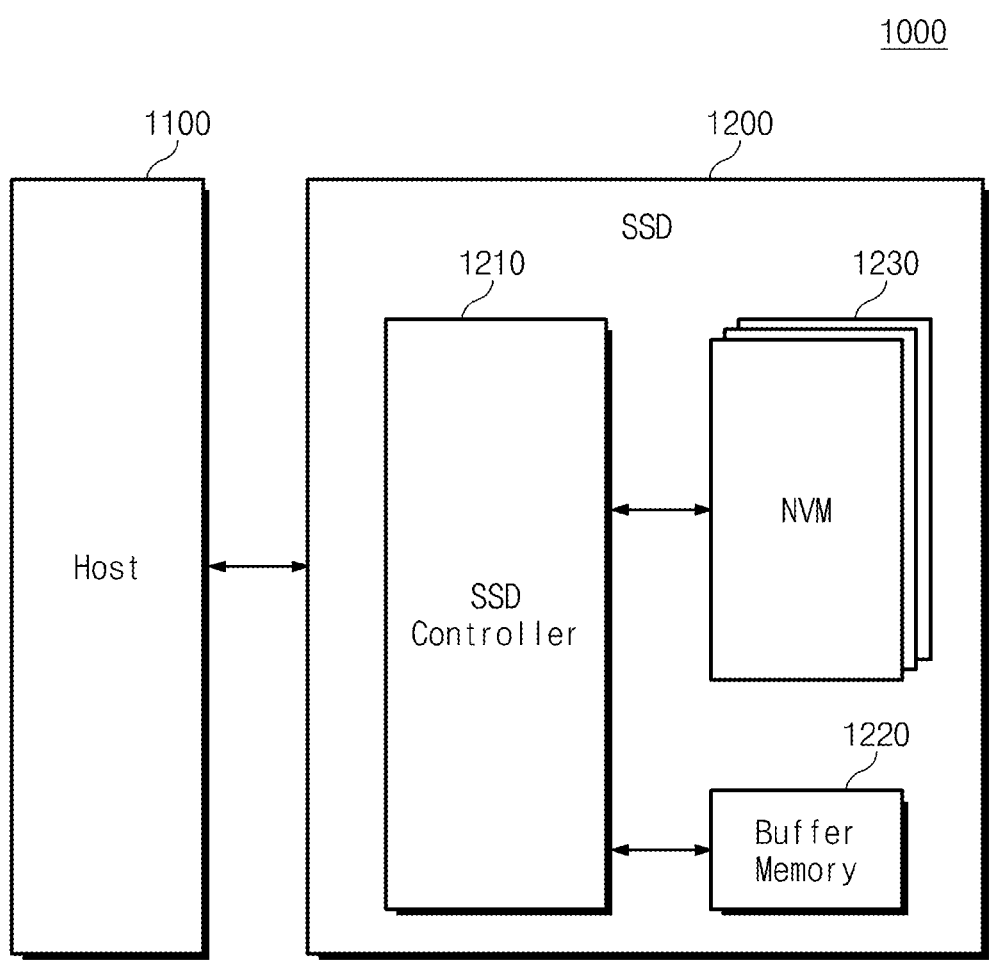
FIG. 14 is a block diagram illustrating a solid state drive (SSD) in accordance with embodiments of the inventive concept.

FIG. 14 is a block diagram illustrating a solid state drive (SSD) in accordance with embodiments of the inventive concept.

Referring to FIG. 14, a SSD system 1000 includes a host 1100 and a SSD 1200. The SSD 1200 includes a SSD controller 1210, a buffer memory 1220 and a nonvolatile memory device 1230.

The SSD controller 1210 provides a physical connection of the host 1100 and the SSD 1200. That is, the SSD controller 1210 provides an interface with the SSD 1200 in response to a bus format of the host 1100. In particular, the SSD controller 1210 decodes a command provided from the host 1100. According to a decoded result, the SSD controller 1210 accesses the nonvolatile memory device 1230. The bus format of the host 1100 may include a universal serial bus (USB), a small computer system interface (SCSI), a PCI express, an ATA, a parallel ATA (PATA), a serial ATA (SATA), a serial attached SCSI (SAS) or the like.

The buffer memory 1220 stores write data provided from the host 1100 or data read from the nonvolatile memory device 1230. In the case that data stored in the nonvolatile memory device 1230 is cached when the host 1100 requests a read operation, the buffer memory 1220 performs a cache function of directly providing the cached data to the host 1100. Generally, the data transmission speed by a bus format (e.g., SATA or SAS) of the host 1100 is greatly faster than the transmission speed of memory channel of the SSD 1200. That is, in the case that an interface speed of the host 1100 is very high, degradation of performance generated due to a speed difference may be minimized by providing a large-capacity buffer memory 1220.

The buffer memory 1220 may be provided to be a synchronous DRAM to provide a sufficient buffering in the SSD 1200 used as a high-capacity auxiliary memory device. However, the buffer memory 1220 may be provided in the various forms.

The nonvolatile memory device 1230 is provided as a storage medium of the SSD 1200. For example, the nonvolatile memory device 1230 may be provided to be a NAND-type flash memory having a mass storage capacity. The nonvolatile memory device 1230 may include a row decoder structure in accordance with an embodiment of the inventive concept.

That is, a layout of the row decoder may be configured to form two high voltage transistors in one active region. In this case, it is possible to form a nonvolatile memory device having high integration and high reliability.

The nonvolatile memory device 1230 may be comprised of a plurality of memory devices. In this case, each memory device is connected to the SSD controller 1210 by a channel unit. The nonvolatile memory device 1230 as a storage medium may be constituted by other nonvolatile memory devices besides a NAND-type flash memory. For example, FRAM, MRAM, ReRAM, FRAM, NOR flash memory may be used as a storage medium and a memory system in which different kinds of memory devices are mixed may be used as a storage medium. A volatile memory device (e.g., DRAM) may also be used as a storage medium.

Figure 15:
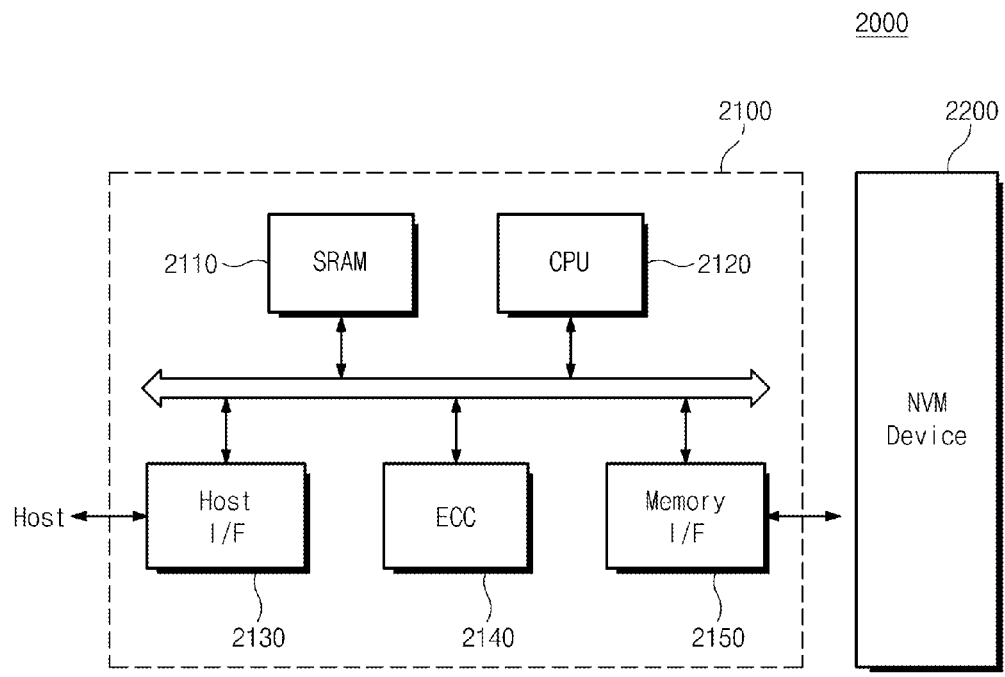
FIG. 15 is a block diagram illustrating a memory system in accordance with embodiments of the inventive concept.

FIG. 15 is a block diagram illustrating a memory system in accordance with embodiments of the inventive concept.

Referring to FIG. 15, a memory system 2000 includes a nonvolatile memory device 2200 and a memory controller 2100.

The memory controller 2100 is configured to control the nonvolatile memory device 2200. A memory card may be provided by combining the nonvolatile memory device 2200 with the memory controller 2100. A SRAM 2110 is used as an operation memory of a central processing unit 2120. A host interface 2130 includes data exchange protocols of a host connected to the memory system 2000. An error correction code block 2140 detects and corrects errors included in data read from the nonvolatile memory device 2200. A memory interface 2150 interfaces with the nonvolatile memory device 2200. The central processing unit 2120 performs the overall control operation for a data exchange of the memory controller 2100. Although not illustrated in the drawing, the memory system 2000 may further include a ROM storing code data for interfacing with the host.

The nonvolatile memory device 2200 may be provided to be a multichip package comprised of a plurality of flash memory chips. The nonvolatile memory device 2200 may include a row decoder structure in accordance with embodiments of the inventive concept. That is, a layout of a row decoder may be configured to form two high voltage transistors in one active region. In this case, it is possible to form a nonvolatile memory device having high integration and high reliability.

The memory system 2000 may be provided as a high reliability storage medium having a low probability of error occurrence. In this case, the memory controller 2100 is configured to communicate with the outside (e.g., host) through one of various interface protocols such as USB, MMC, PCI-E, SAS, SATA, PATA, SCSI, ESDI and IDE.

Figure 16:
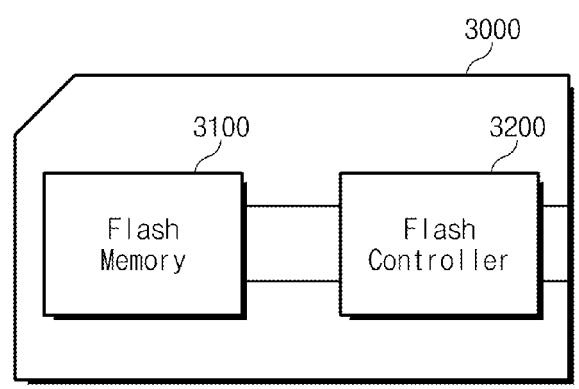
FIG. 16 is a block diagram illustrating a memory card in accordance with embodiments of the inventive concept.

FIG. 16 is a block diagram illustrating a memory card in accordance with some other embodiments of the inventive concept.

Referring to FIG. 16, a memory card 3000 may include a flash memory 3100 and a flash controller 3200. The flash controller 3200 may control the flash memory 3100 on the basis of control signals received from the outside of the memory card 3000.

The flash memory 3100 may be constituted to be the same as the flash memory 100 illustrated in FIG. 1. The flash memory 3100 may include the row decoder structure in accordance with embodiments of the inventive concept. That is, a layout of a row decoder may be configured to form two high voltage transistors in one active region. In this case, the flash memory 3100 may have a high integration and high reliability. The flash memory 3100 may be constituted by one of a stack flash structure in which arrays are multi-stacked, a flash structure without source-drain, a pin-type flash structure and a three dimensional flash structure.

The memory card 3000 may constitute a memory card device, a multimedia card device, a SD device, a memory stick device, a hard disk drive device, a hybrid drive device or a general-purpose serial bus flash device. For example, the memory card 3000 may constitute a card satisfying an industry standard that can be applied to a user device such as a digital camera, a personal computer and so on.

Figure 17:
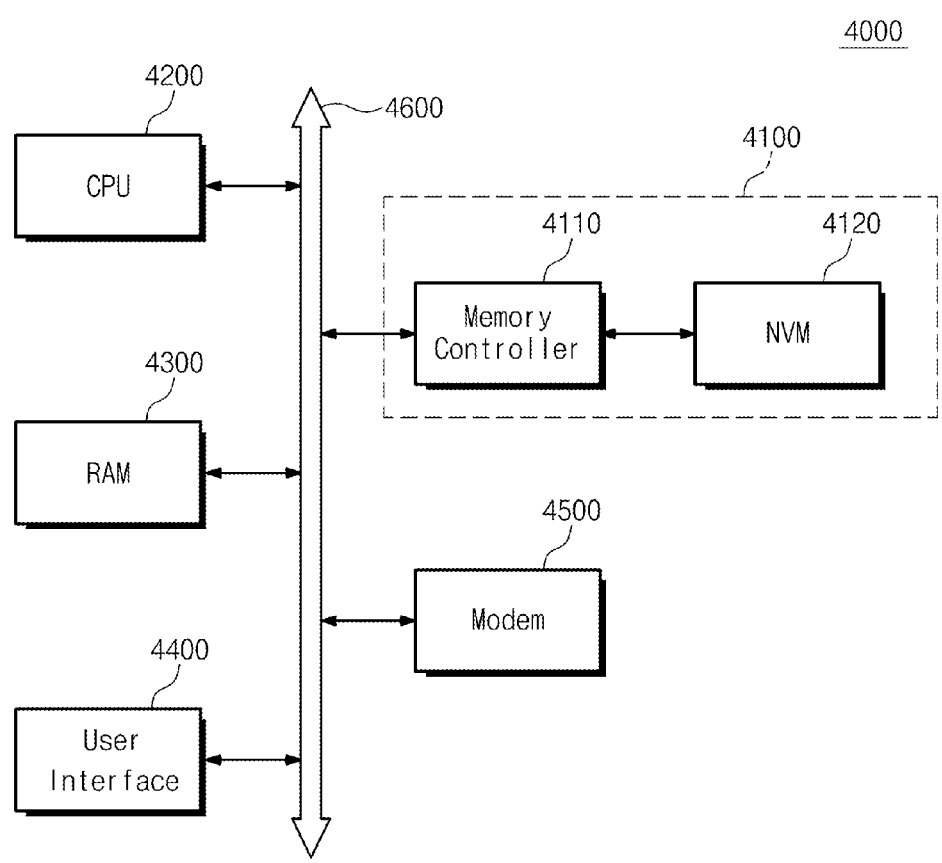
FIG. 17 is a block diagram illustrating a computing system in accordance with embodiments of the inventive concept.

FIG. 17 is a block diagram illustrating a computing system including a flash memory device. A computing system 4000 in accordance with embodiments of the inventive concept includes a microprocessor 4200, a RAM 4300, a user interface 4400, a modem 4500 such as a baseband chipset that are electrically connected to a system bus 4600, and a memory system 4100.

If the computing system 4000 is a mobile device, a battery (not illustrated) for providing an operation voltage of the computing system 4000 may be further provided to the computing system 4000. Although not illustrated in the drawing, the computing system 4000 may further include an application chipset, a camera image processor (CIS), a mobile DRAM or the like. The memory system 4100 may be constituted by, for example, a solid state drive (SSD) using a nonvolatile memory device to store data. Also, the memory system 4100 may be provided to be a fusion flash memory (e.g., One-NAND® flash memory).

The memory system 4100 includes a memory controller 4110 and a flash memory 4120. The flash memory 4120 may include the row decoder structure in accordance with embodiments of the inventive concept. That is, a layout of a row decoder may be configured to form two high voltage transistors in one active region.

The nonvolatile memory device and/or the memory controller in accordance with the inventive concept can be mounted in various types of package technologies. As examples, the nonvolatile memory device and/or the memory controller can be packaged as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

The nonvolatile memory device in accordance with embodiments of the inventive concept allows for a reduction in an area dedicated to a pass transistor transmitting a word line voltage, thereby increasing pass transistor spacing, and allowing for a decrease in interference between the pass transistors.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A nonvolatile memory device comprising:
   a plurality of memory blocks; and
   a row decoder connected to word lines of the plurality of memory blocks, the row decoder comprising a pass transistor array transmitting a plurality of drive signals along the word lines to a selected memory block among the plurality of memory blocks in response to a block select signal, wherein the pass transistor array comprises first and second pass transistor portions respectively located adjacent first and second sides of the plurality of memory blocks, the first and second pass transistor portions respectively comprising high voltage transistors including one common drain and two sources formed in one active region and one of the plurality of drive signals transmitted to the common drain is transmitted to different memory blocks through the two sources.

2. The nonvolatile memory device of claim 1, wherein the plurality of drive signals comprises at least one of a string select signal, a ground select signal and word line voltages provided to a word line of the selected memory block.

3. The nonvolatile memory device of claim 1, wherein the high voltage transistors comprise:
 a first gate line formed on the active region; and
 a second gate line formed on the active region, the second gate line being parallel to the first gate line and being electrically separated from the first gate line.

4. The nonvolatile memory device of claim 3, further comprising a drive signal line transmitting one of the plurality of drive signals in a direction crossing the first and second gate lines, wherein the drive signal line is formed on the first and second gate lines.

5. The nonvolatile memory device of claim 4, wherein the drive signal line comprises:
 a first signal line transmitting a first drive signal; and
 a second signal line transmitting a second drive signal electrically separated from the first drive signal,
 wherein one of the first signal line and the second signal line is electrically connected to the common drain.

6. The nonvolatile memory device of claim 3, further comprising:
 a first interconnection connecting one of the two sources and a first memory block; and
 a second interconnection connecting the other of the two sources and a second memory block.

7. The nonvolatile memory device of claim 6, wherein each of the drive signal line, the first interconnection and the second interconnection is a metal line.

8. The nonvolatile memory device of claim 1, wherein the pass transistor array further comprises a plurality of other pass transistor portions, and
 wherein a memory block adjacent to a memory block which another pass transistor portion selects is provided with a drive signal from other drive signal lines electrically separated from drive signal lines connected to the another pass transistor portion.

9. A nonvolatile memory device comprising:
 a first memory block and a second memory block; and
 two pass transistors selectively transmitting a word line voltage to one of the first and second memory blocks in response to a block select signal,
 wherein the two pass transistors comprise:
 a first gate line and a second gate line formed in parallel to each other on one active region;
 a common drain formed between the first gate line and the second gate line and provided with the word line voltage;

a first source outputting the word line voltage provided in the common drain to the first memory block in response to a first block select signal; and
a second source outputting the word line voltage provided in the common drain to the second memory block in response to a second block select signal.

10. The nonvolatile memory device of claim 9, wherein at least one third memory block is interposed between the first memory block and the second memory block.

11. The nonvolatile memory device of claim 10, wherein the first gate line and the second gate line are electrically separated from each other.

12. The nonvolatile memory device of claim 9, further comprising a drive signal line for transmitting the word line voltage to the common drain, wherein the drive signal line is connected to the common drain through a contact plug.

13. The nonvolatile memory device of claim 9, further comprising metal interconnections formed between the first source and a word line of the first memory block and between the second source and a word line of the second memory block respectively.

14. The nonvolatile memory device of claim 9, further comprising other pass transistors sharing the first and second gate lines, the other pass transistors being formed of a same configuration as the two pass transistors.

15. A nonvolatile memory device comprising:
 a memory cell array comprising a plurality of memory blocks;
 a first pass transistor portion located adjacent a first side of the memory cell array, the first pass transistor portion including first high voltage transistors including one common drain and two sources formed in one active region, and one of a plurality of first drive signals transmitted to the common drain is transmitted to first and second memory blocks among the plurality of memory blocks through the two sources; and
 a second pass transistor portion located adjacent a second side of the memory cell array opposite the first side of the memory cell array, the second pass transistor portion including second high voltage transistors including one common drain and two sources formed in one active region, and one of a plurality of second drive signals transmitted to the common drain of the second high voltage transistors is transmitted to third and fourth memory blocks among the plurality of memory blocks through the two sources of the second high voltage transistors.

16. The nonvolatile memory device of claim 15, wherein at least one memory block among the plurality of memory blocks is located between the first and second memory blocks, and wherein at least one memory block among the plurality of memory blocks is located between the third and fourth memory blocks.

17. The nonvolatile memory device of claim 16, wherein each memory block includes a plurality of memory cell strings, and each memory cell string includes a plurality of nonvolatile memory cells connected between a string select line and a common source line.

18. The nonvolatile memory device of claim 17, wherein channels of the memory cell strings extend horizontally relative a substrate surface.

19. The nonvolatile memory device of claim 17, wherein channels of the memory cell strings extend vertically relatively a substrate surface.

* * * * *